United States Patent
Irie

(10) Patent No.: US 10,939,056 B2
(45) Date of Patent: Mar. 2, 2021

(54) IMAGING APPARATUS, IMAGING METHOD, IMAGING PROGRAM

(71) Applicant: FUJIFILM Corporation, Tokyo (JP)

(72) Inventor: Fuminori Irie, Saitama (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 16/355,092

(22) Filed: Mar. 15, 2019

(65) Prior Publication Data
US 2019/0214416 A1    Jul. 11, 2019

Related U.S. Application Data

(63) Continuation of application No. PCT/JP2017/029198, filed on Aug. 10, 2017.

(30) Foreign Application Priority Data

Sep. 16, 2016    (JP) .............................. JP2016-181517

(51) Int. Cl.
*H04N 5/353* (2011.01)
*H04N 5/232* (2006.01)
(Continued)

(52) U.S. Cl.
CPC ....... *H04N 5/353* (2013.01); *H01L 27/14605* (2013.01); *H04N 5/232* (2013.01);
(Continued)

(58) Field of Classification Search
CPC ............. H04N 5/232; H04N 5/232122; H04N 5/2353; H04N 5/341; H04N 5/353; H04N 5/36961; H01L 27/14605
See application file for complete search history.

(56) References Cited

U.S. PATENT DOCUMENTS 8,786,734 B2 * 7/2014 Haneda ................ H04N 5/3454
                                                                    348/231.99
2007/0285548 A1    12/2007 Gomi
(Continued)

FOREIGN PATENT DOCUMENTS

CN        1925563 A     3/2007
CN      102300038 A    12/2011
(Continued)

OTHER PUBLICATIONS

Japanese Office Action dated Sep. 24, 2019, for corresponding Japanese Patent Application No. 2019-002472, with English translation.
(Continued)

*Primary Examiner* — Lin Ye
*Assistant Examiner* — Chriss S Yoder, III
(74) *Attorney, Agent, or Firm* — Birch, Stewart, Kolasch & Birch, LLP

(57) ABSTRACT

An imaging apparatus includes: an imaging element; an imaging controller; a signal output controller; and an imaging condition determination section as defined herein, the signal output controller divides the first imaging signal stored in the storage section into a plurality of groups and sequentially outputs the first imaging signal from the imaging element for each of the groups, and the imaging controller causes the sensor section to perform the temporary imaging by performing the temporary imaging control, during a period from when all the imaging signals belonging to at least one of the groups are output from the imaging element until all the imaging signals belonging to all the groups are output from the imaging element, and determines the exposure condition at the temporary imaging based on the imaging signal stored in the storage section through the
(Continued)

imaging performed by the sensor section before the actual imaging.

24 Claims, 9 Drawing Sheets

(51) Int. Cl.
*H01L 27/146* (2006.01)
*H04N 5/235* (2006.01)
*H04N 5/341* (2011.01)
*H04N 5/369* (2011.01)

(52) U.S. Cl.
CPC ..... *H04N 5/2353* (2013.01); *H04N 5/232122* (2018.08); *H04N 5/341* (2013.01); *H04N 5/36961* (2018.08)

(56) References Cited

U.S. PATENT DOCUMENTS

| | | |
|---|---|---|
| 2010/0231757 A1 | 9/2010 | Sambongi |
| 2011/0317992 A1 | 12/2011 | Takeshita |
| 2012/0120263 A1 | 5/2012 | Li et al. |
| 2012/0169893 A1 | 7/2012 | Lee et al. |
| 2012/0281132 A1 | 11/2012 | Ogura et al. |
| 2015/0264242 A1 | 9/2015 | Tanaka et al. |
| 2016/0301847 A1 | 10/2016 | Okazawa |
| 2017/0310870 A1 | 10/2017 | Takahashi |

FOREIGN PATENT DOCUMENTS

| | | |
|---|---|---|
| CN | 102469253 A | 5/2012 |
| CN | 102547130 A | 7/2012 |
| CN | 102595050 A | 7/2012 |
| CN | 102696219 A | 9/2012 |
| CN | 105407276 A | 3/2016 |
| JP | 2002-112095 A | 4/2002 |
| JP | 2005-117192 A | 4/2005 |
| JP | 2007-324985 A | 12/2007 |
| JP | 2010-200177 A | 9/2010 |
| JP | 2012-147187 A | 8/2012 |
| JP | 2015-176114 A | 10/2015 |
| JP | 2016-1807 A | 1/2016 |
| JP | 2016-18033 A | 2/2016 |
| JP | 2016-96459 A | 5/2016 |

OTHER PUBLICATIONS

International Preliminary Report on Patentability and Written Opinion of the International Seaching Authority (Form PCT/IPEA/409) for International Application No. PCT/JP2017/029198, dated Jan. 12, 2018, with English translation.
International Search Report and Written Opinion of the International Searching Authority (Forms PCT/ISA/210 and PCT/ISA/237) for International Application No. PCT/JP2017/029198, dated Sep. 26, 2017, with an English translation of the International Search Report.
Chinese Office Action and Search Report for corresponding Chinese Application No. 201730056809.8, dated Jun. 1, 2020, with an English translation.

* cited by examiner

WHICH IS USED FOR IMAGING CONDITION DETERMINATION

WHICH IS USED FOR IMAGING CONDITION DETERMINATION

IMAGING APPARATUS, IMAGING METHOD, IMAGING PROGRAM

CROSS REFERENCE TO RELATED APPLICATION

This is a continuation of International Application No. PCT/JP2017/029198 filed on Aug. 10, 2017, and claims priority from Japanese Patent Application No. 2016-181517 filed on Sep. 16, 2016, the entire disclosures of which are incorporated herein by reference.

BACKGROUND OF THE INVENTION

1. Field of the Invention

The present invention relates to an imaging apparatus, an imaging method, and a computer readable medium storing an imaging program.

2. Description of the Related Art

Recently, there has been a rapid increase in the demand for information devices having imaging functions such as digital still cameras, digital video cameras, or mobile phones equipped with cameras, in accordance with an increase in resolution of imaging elements such as electric charge coupled device (CCD) image sensors and complementary metal oxide semiconductor (CMOS) image sensors. It should be noted that information devices having the above-mentioned imaging functions are referred to as imaging apparatuses.

In the imaging apparatus, information about the subject being imaged is acquired on the basis of the captured image signal obtained by the imaging performed before the actual imaging for storage, and an imaging condition such as exposure or a position of the focus lens at the actual imaging is determined on the basis of the information.

JP2016-001807A and JP2015-176114A each describe an imaging apparatus that changes exposure control of an imaging element at actual imaging for storage and exposure control of an imaging element at imaging for determining imaging conditions.

SUMMARY OF THE INVENTION

It is assumed that still images are continuously captured. In this case, in order to shorten the imaging interval of the still images, it is preferable to determine an imaging condition at optional actual imaging for storage on the basis of a captured image signal obtained by separate actual imaging just before this optional actual imaging.

However, another imaging condition at actual imaging is a condition suitable for storage, and is not an appropriate condition for determining the imaging condition. For this reason, in some cases, appropriate imaging conditions may not be determined from the captured image signal.

For example, in a case where the imaging element includes a phase difference detection pixel, a level of the signal, which is output from the phase difference detection pixel, in the captured image signal obtained at the separate actual imaging may be too low or too high to detect a phase difference. In this case, the accuracy in determination of the position of the focus lens at the optional actual imaging is reduced.

In a case where exposure at the separate actual imaging is changed from the appropriate exposure or is manually set by user setting or the like, the exposure determined on the basis of the captured image signal obtained at the separate actual imaging may be inappropriate. For this reason, the accuracy in determination of the appropriate exposure at the optional actual imaging is deteriorated.

In order to improve the accuracy in determination of the imaging condition at the optional actual imaging, for example, after the separate actual imaging is performed, pre-imaging may be performed under appropriate imaging conditions for determining the imaging condition at the optional actual imaging.

However, in this method, since the pre-imaging is performed after waiting for the captured image signal generated through the separate actual imaging to be output from the imaging element, the imaging interval of the still images becomes long.

JP2016-001807A and JP2015-176114A do not take into consideration the case where the imaging for storage is continuously performed.

The present invention has been made in view of the above-mentioned situations, and an object of the present invention is to provide an imaging apparatus, an imaging method, and an imaging program capable of achieving both shortening of an imaging interval and improvement of imaging quality in a case where the imaging for storage is continuously performed.

According to an embodiment of the present invention, there is provided an imaging apparatus comprising: an imaging element that has a sensor section, which includes a light-receiving surface where a plurality of pixel rows each consisting of a plurality of pixels arranged in one direction are arranged in a direction orthogonal to the one direction and which captures an image of a subject through an imaging optical system, and a storage section which stores a signal output from the sensor section; an imaging controller that performs imaging control including actual imaging control, which causes the sensor section to perform actual imaging for storage and which causes the sensor section to output an imaging signal corresponding to an electric charge accumulated in each of the plurality of pixels through the actual imaging, and temporary imaging control which causes the sensor section to perform temporary imaging for determining an imaging condition at actual imaging subsequent to the actual imaging under an exposure condition different from an exposure condition at the actual imaging after the imaging signal is stored in the storage section through the actual imaging control and which causes the sensor section to output an imaging signal corresponding to an electric charge accumulated in each of some pixels of the plurality of pixels through the temporary imaging; a signal output controller that causes the imaging element to output the imaging signal stored in the storage section through the imaging control; and an imaging condition determination section that determines the imaging condition at the subsequent actual imaging, on the basis of at least a second imaging signal out of a first imaging signal, which is output from the sensor section through the actual imaging control, stored in the storage section, and output from the imaging element by the signal output controller, and the second imaging signal which is output from the sensor section through the temporary imaging control, stored in the storage section, and output from the imaging element by the signal output controller. The signal output controller divides the first imaging signal stored in the storage section into a plurality of groups and sequentially outputs the first imaging signal from the imaging element for each of the groups. The imaging controller causes the sensor section to perform the temporary imaging by performing the temporary imaging control, during a period from when all the imaging signals belonging to at least one of the groups are output from the imaging element until all the imaging signals belonging to all the groups are output from the imaging element.

According to an embodiment of the present invention, there is provided an imaging method of using an imaging element that has a sensor section, which includes a light-receiving surface where a plurality of pixel rows each consisting of a plurality of pixels arranged in one direction are arranged in a direction orthogonal to the one direction and which captures an image of a subject through an imaging optical system, and a storage section which stores a signal output from the sensor section. The imaging method comprises: an imaging control step of performing imaging control including actual imaging control, which causes the sensor section to perform actual imaging for storage and which causes the sensor section to output an imaging signal corresponding to an electric charge accumulated in each of the plurality of pixels through the actual imaging, and temporary imaging control which causes the sensor section to perform temporary imaging for determining an imaging condition at actual imaging subsequent to the actual imaging under an exposure condition different from an exposure condition of the actual imaging after the imaging signal is stored in the storage section through the actual imaging control and which causes the sensor section to output an imaging signal corresponding to an electric charge accumulated in each of some pixels of the plurality of pixels through the temporary imaging; a signal output control step of causing the imaging element to output the imaging signal stored in the storage section through the imaging control; and an imaging condition determination step of determining the imaging condition at the subsequent actual imaging, on the basis of at least a second imaging signal out of a first imaging signal, which is output from the sensor section through the actual imaging control, stored in the storage section, and output from the imaging element by the signal output control step, and the second imaging signal which is output from the sensor section through the temporary imaging control, stored in the storage section, and output from the imaging element by the signal output control step. In the signal output control step, the first imaging signal stored in the storage section is divided into a plurality of groups and is sequentially output from the imaging element for each of the groups. In the imaging control step, the sensor section performs the temporary imaging by performing the temporary imaging control, during a period from when all the imaging signals belonging to at least one of the groups are output from the imaging element until all the imaging signals belonging to all the groups are output from the imaging element.

According to an embodiment of the present invention, there is provided an imaging program for capturing an image of a subject by using an imaging element that has a light-receiving surface in which a plurality of pixel rows each consisting of a plurality of pixels arranged in one direction are arranged in a direction orthogonal to the one direction and a storage section which stores signals read out from the plurality of pixels so as to capture the image of the subject through an imaging optical system. The imaging program causes a computer to execute: an imaging control step of performing imaging control including actual imaging control, which causes the imaging element to perform actual imaging for storage and which reads an imaging signal corresponding to an electric charge accumulated in each of the plurality of pixels through the actual imaging, and temporary imaging control which causes the imaging element to perform temporary imaging for determining an imaging condition at actual imaging subsequent to the actual imaging under an exposure condition different from an exposure condition of the actual imaging after the imaging signal is stored in the storage section through the actual imaging control and which reads an imaging signal corresponding to an electric charge accumulated in each of some pixels of the plurality of pixels through the temporary imaging; a signal output control step of causing the imaging element to output the imaging signal stored in the storage section through the imaging control; and an imaging condition determination step of determining the imaging condition at the subsequent actual imaging, on the basis of at least a second imaging signal out of a first imaging signal, which is output from the plurality of pixels through the actual imaging control, stored in the storage section, and output from the imaging element by the signal output control step, and the second imaging signal which is output from the some pixels through the temporary imaging control, stored in the storage section, and output from the imaging element by the signal output control step. In the signal output control step, the first imaging signal stored in the storage section is divided into a plurality of groups and is sequentially output from the imaging element for each of the groups. In the imaging control step, the imaging element performs the temporary imaging by performing the temporary imaging control, during a period from when all the imaging signals belonging to at least one of the groups are output from the imaging element until all the imaging signals belonging to all the groups are output from the imaging element.

According to the embodiments of the present invention, it is possible to provide an imaging apparatus, an imaging method, and an imaging program capable of achieving both shortening of an imaging interval and improvement of imaging quality in a case where the imaging for storage is continuously performed.

DESCRIPTION OF THE PREFERRED EMBODIMENTS

Hereinafter, embodiments of the present invention will be described with reference to the drawings.

Figure 1:
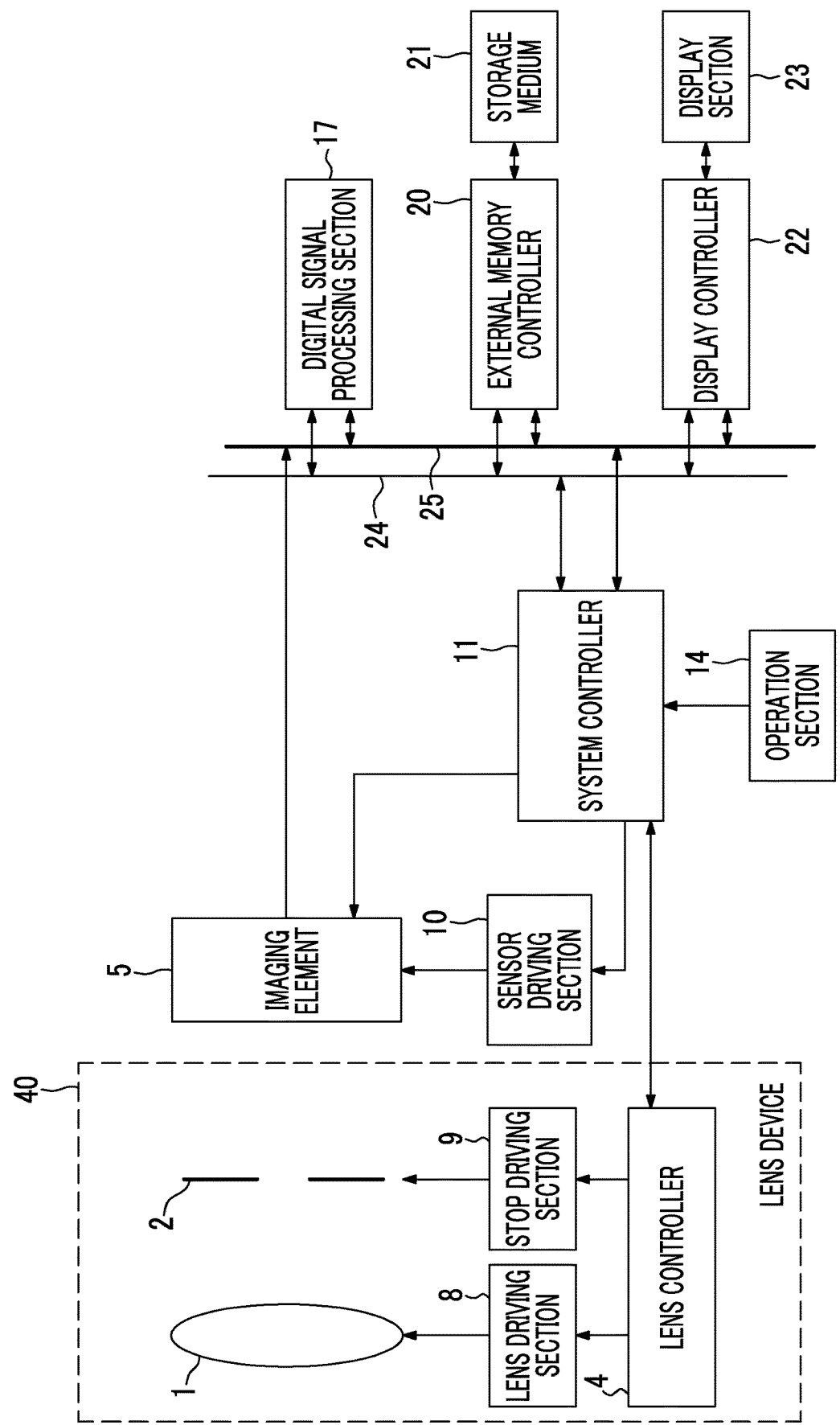
FIG. 1 is a diagram illustrating a schematic configuration of a digital camera as an example of an imaging apparatus for explaining an embodiment of the present invention.

FIG. 1 is a diagram illustrating a schematic configuration of a digital camera as an example of an imaging apparatus for explaining an embodiment of the present invention.

The digital camera illustrated in FIG. 1 comprises a lens device 40 having an imaging lens 1, a stop 2, a lens controller 4, a lens driving section 8, and a stop driving section 9.

In description of the present embodiment, the lens device 40 is attachable to and detachable from a digital camera body, but may be fixed to the digital camera body.

The imaging lens 1 and the stop 2 constitute an imaging optical system, and the imaging optical system includes a focus lens.

This focus lens is a lens for adjusting the focus of the imaging optical system, and is composed of a single lens or a plurality of lenses. Focus adjustment is performed by moving the focus lens in a direction of the optical axis of the imaging optical system.

As the focus lens, a liquid lens capable of changing a focal position by variably controlling the curved surface of the lens may be used.

The lens controller 4 of the lens device 40 is configured to be capable of communicating with the system controller 11 of the digital camera body through wire or wireless.

In accordance with a command from the system controller 11, the lens controller 4 drives the focus lens included in the imaging lens 1 through the lens driving section 8, and drives the stop 2 through the stop driving section 9.

The digital camera body comprises a MOS type imaging element 5 that captures an image of a subject through an imaging optical system, a sensor driving section 10, a system controller 11 that integrally controls the entire electric control system of the digital camera, and an operation section 14.

The system controller 11 is configured to include various processors, a random access memory (RAM), and a read only memory (ROM), thereby totally controlling the entire digital camera.

Various kinds of processors include a programmable logic device (PLD) that is a processor capable of changing a circuit configuration after manufacturing of a central processing unit (CPU), a field programmable gate array (FPGA), or the like as a general-purpose processor that performs various kinds of processing by executing programs, a dedicated electric circuit that is a processor having a circuit configuration designed exclusively for executing specific processing of an application specific integrated circuit (ASIC) or the like, and the like.

More specifically, a structure of these various processors is an electric circuit in which circuit elements such as semiconductor elements are combined.

The processor of the system controller 11 may be configured as one of various processors, or may be configured as a combination of two or more of the same or different kinds of processors (for example, a combination of a plurality of FPGAs or a combination of a CPU and an FPGA).

The processor of the system controller 11 implements each function described later by executing the imaging program stored in the ROM built into the system controller 11.

Further, the electric control system of the digital camera comprises: a digital signal processing section 17 that performs interpolation calculation, gamma correction calculation, RGB/YC conversion processing, and the like on the actually captured image signal, which will be described later and is output from the imaging element 5, so as to generate captured image data; an external memory controller 20 to which a storage medium 21 is attachably and detachably connected; and a display controller 22 to which a display section 23 mounted on the rear surface of the camera or the like is connected.

The digital signal processing section 17 includes a processor, a RAM, and a ROM, and executes various kinds of processing by causing this processor to execute the program stored in the ROM.

The digital signal processing section 17, the external memory controller 20, and the display controller 22 are connected to one another through the control bus 24 and the data bus 25, and operate on the basis of a command from the system controller 11.

Figure 2:
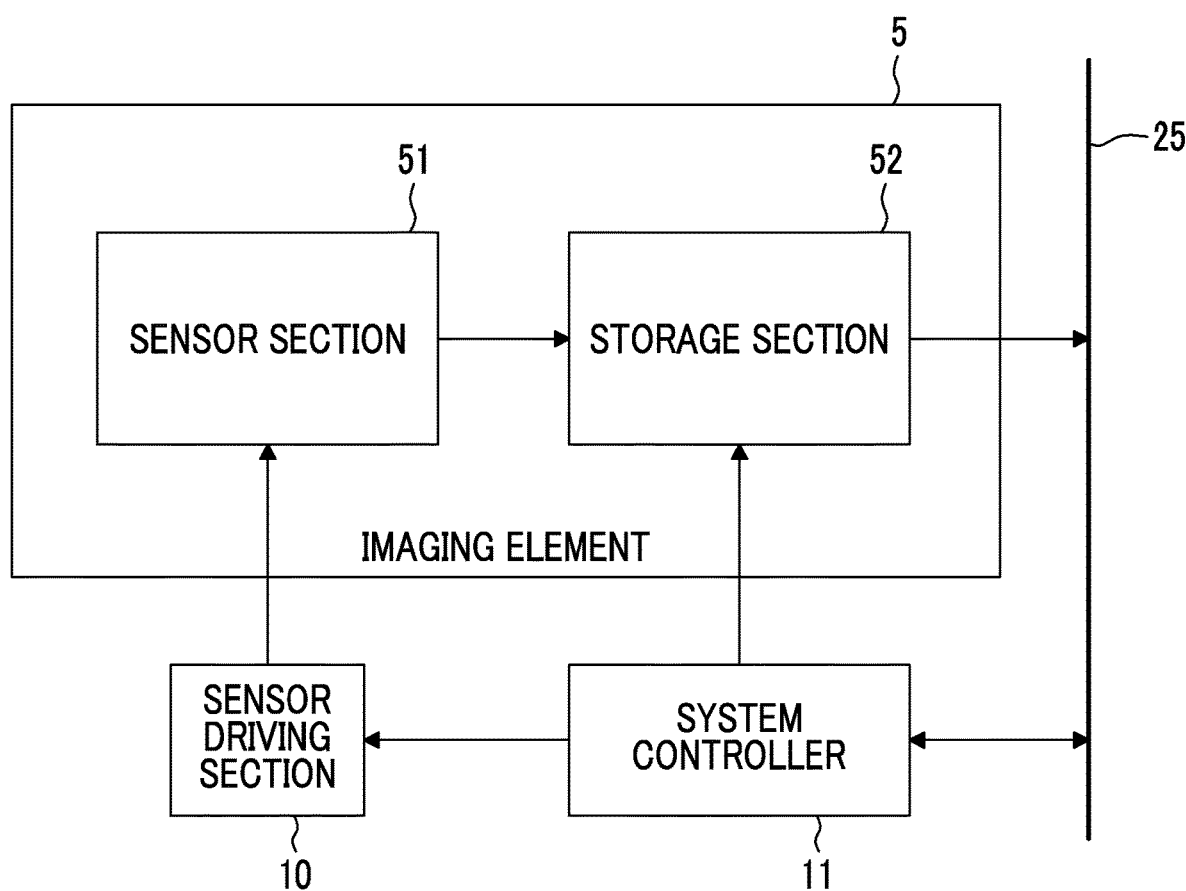
FIG. 2 is a schematic diagram illustrating a schematic configuration of an imaging element 5 mounted on the digital camera illustrated in FIG. 1.

FIG. 2 is a schematic diagram illustrating a schematic configuration of the imaging element 5 mounted on the digital camera illustrated in FIG. 1.

The imaging element 5 includes a sensor section 51 and a storage section 52.

The sensor section 51 captures an image of a subject and outputs a captured image signal. The sensor section 51 is driven by the sensor driving section 10.

The storage section 52 stores the captured image signal output from the sensor section 51, and includes a large number of storage elements such as a capacitor or a flip-flop for storing data, and a control circuit, which is not shown, for controlling storage and readout of the data of the large number of storage elements. This control circuit is controlled by the system controller 11.

The storage section 52 may be anything including a rewritable memory element, and a semiconductor memory, a ferroelectric memory, or the like can be used.

For example, a static random access memory (SRAM), a dynamic random access memory (DRAM), a ferroelectric random access memory (FRAM, registered trademark), a flash memory, or the like can be used as the storage section 52.

The storage section 52 can store the same number of imaging signals as the total number of pixels included in the sensor section 51.

Further, the imaging element 5 includes an interface prescribed by a standard such as a scalable low voltage signaling (SLVS) which is not shown. The captured image signal stored in the storage section 52 is output to the data bus 25 through this interface.

As the configuration of the imaging element 5, for example, the following four configurations may be adopted, but the invention is not limited thereto.

[1] A configuration in which the sensor section 51 and the storage section 52 are integrated into one chip

[2] A configuration in which the chip in which the sensor section 51 is formed and the chip in which the storage section 52 is formed are laminated and the two chips are electrically connected through stud bumps

[3] A configuration in which the sensor section 51 and the storage section 52 are housed in one package, and the pads of the sensor section 51 and the pads of the storage section 52 are connected through wire bonding

[4] A configuration in which the sensor section 51 and the storage section 52 are housed in separate packages and these two packages are connected through a lead frame From the viewpoint of reduction in power consumption of the imaging element 5, high speed, and reduction in size, the configuration of [1] is most desirable, the configuration of [2] is desirable with a priority lower than that of [1], the configuration of [3] is desirable with a priority lower than that of [2], the configuration of [4] is desirable with a priority lower than that of [3]. According to the configurations of [3] and [4], the imaging element 5 can be manufactured without using advanced techniques.

Figure 3:
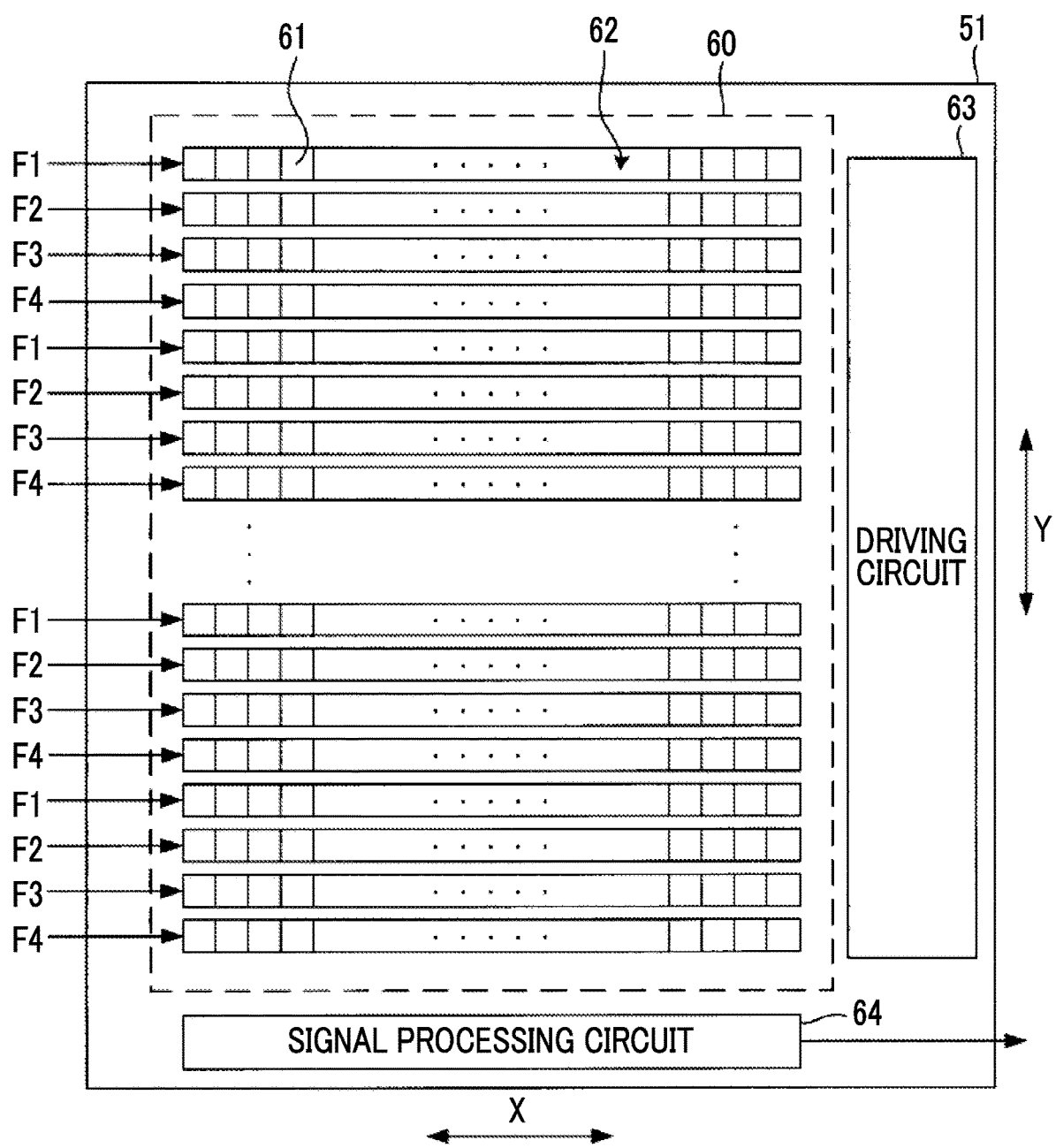
FIG. 3 is a schematic plan view illustrating a configuration of a sensor section 51 of the imaging element 5 illustrated in FIG. 2.

FIG. 3 is a schematic plan view illustrating a configuration of a sensor section 51 of the imaging element 5 illustrated in FIG. 2.

The sensor section 51 comprises: a light-receiving surface 60 on which a plurality of pixel rows 62 consisting of a plurality of pixels 61 arranged in a row direction X which is one direction are arranged in a column direction Y orthogonal to the row direction X; a driving circuit 63 that drives the pixels arranged on the light-receiving surface 60; and a signal processing circuit 64 that processes imaging signals which are read out from the respective pixels 61 of the pixel rows 62 arranged on the light-receiving surface 60.

In FIG. 3, the upper end of the light-receiving surface 60 in the column direction Y is referred to as the upper end, and the lower end of the light-receiving surface 60 in the column direction Y is referred to as the lower end.

The pixel 61 includes a photoelectric conversion section that receives light passing through the imaging optical system of the lens device 40 and generates and accumulates electric charge corresponding to the amount of received light, and a reading circuit that converts the electric charge, which is accumulated in the photoelectric conversion section, into a voltage signal and reads the voltage signal as an imaging signal from each signal line.

A well-known configuration can be adopted for the reading circuit.

The reading circuit includes, for example, a transfer transistor for transferring the electric charge, which is accumulated in the photoelectric conversion section, to the floating diffusion, a reset transistor for resetting the potential of the floating diffusion, an output transistor that outputs a voltage signal corresponding to the potential of the floating diffusion, and a selection transistor for selectively reading the voltage signal, which is output from the output transistor, to the signal line.

It should be noted that the reading circuit may be shared by a plurality of photoelectric conversion sections in some cases.

An area of the light-receiving surface 60, which includes the (4N+1)th pixel rows 62 from the upper end side of the light-receiving surface 60 among all the pixel rows 62 arranged on the light-receiving surface 60 where N is an integer of 0 or more, is referred to as a field F1.

An area of the light-receiving surface 60, which includes the (4N+2)th pixel rows 62 from the upper end side of the light-receiving surface 60 among all the pixel rows 62 arranged on the light-receiving surface 60, is referred to as a field F2.

An area of the light-receiving surface 60, which includes the (4N+3)th pixel rows 62 from the upper end side of the light-receiving surface 60 among all the pixel rows 62 arranged on the light-receiving surface 60, is referred to as a field F3.

An area of the light-receiving surface 60, which includes the (4N+4)th pixel rows 62 from the upper end side of the light-receiving surface 60 among all the pixel rows 62 arranged on the light-receiving surface 60, is referred to as a field F4.

The pixels 61 composing the pixel rows 62 in any one of the fields F1 to F4 (hereinafter referred to as the field Fi) include the phase difference detection pixels.

The phase difference detection pixel is a pixel for detecting a phase difference between two images on the basis of a pair of rays passing through two different portions arranged in the row direction X of the pupil area of the imaging optical system of the lens device 40.

The phase difference detection pixels include a first pixel including a first photoelectric conversion section which receives one of the pair of rays and in which electric charge corresponding to the amount of received light is accumulated, and a second pixel including a second photoelectric conversion section which receives the other of the pair of rays and in which electric charge corresponding to the amount of received light is accumulated.

In the field Fi, a plurality of pairs of the first pixel and the second pixel are arranged, and the phase difference can be calculated on the basis of the signals which are read out from the pairs.

It should be noted that the phase difference detection pixels may be composed of pixels including both of the first photoelectric conversion section and the second photoelectric conversion section.

The driving circuit 63 drives the reading circuit connected to the photoelectric conversion section of each pixel 61 on a pixel row basis so as to reset each photoelectric conversion section included in this pixel row 62 and read the voltage signal corresponding to the electric charge accumulated in the photoelectric conversion section to the signal line for each pixel row 62.

The signal processing circuit 64 performs a correlative double sampling processing on the voltage signal read out from each pixel 61 of the pixel row 62 to the signal line, converts the voltage signal, which is subjected to the correlative double sampling processing, into a digital signal, and outputs the signal to the storage section 52.

The digital signal, which is read out from the optional pixel 61 to the signal line and processed by the signal processing circuit 64, is an imaging signal corresponding to the electric charge accumulated in the photoelectric conversion section of this optional pixel 61.

Figure 4:
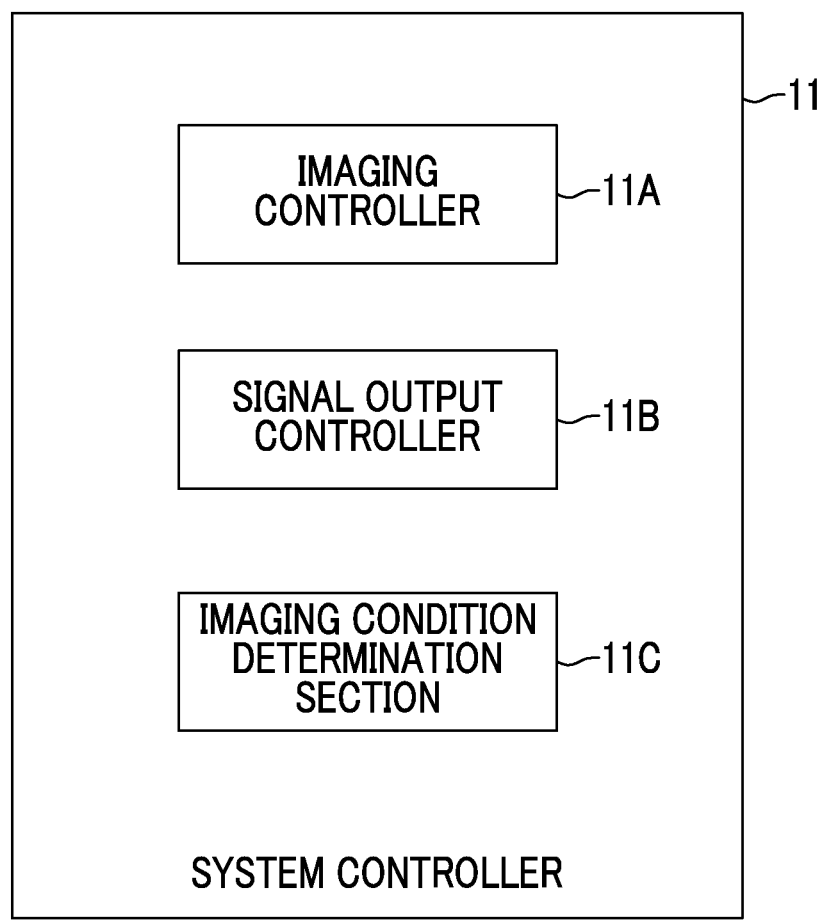
FIG. 4 is a diagram illustrating functional blocks of a system controller 11 illustrated in FIG. 1.

FIG. 4 is a diagram illustrating functional blocks of the system controller 11 illustrated in FIG. 1.

In the system controller 11, the processor, which execute the imaging program, functions as an imaging controller 11A, a signal output controller 11B, and an imaging condition determination section 11C.

The digital camera in FIG. 1 is equipped with a continuous imaging mode in which imaging for storage is continuously performed a plurality of times.

In the continuous imaging mode, in a case where an instruction to perform imaging for storage (hereinafter referred to as an imaging instruction) to be stored in the storage medium 21 is issued, in accordance with this instruction, the imaging controller 11A continuously performs imaging control including actual imaging control and temporary imaging control a plurality of times.

In the actual imaging control, by controlling the driving circuit 63, the sensor section 51 performs the actual imaging for storage. The actual imaging control is control for causing the sensor section 51 to output the imaging signal corresponding to the electric charge accumulated in each of all the pixels 61 of the light-receiving surface 60 through this actual imaging.

In the present specification, the term "imaging" performed by the sensor section 51 means a process of resetting the photoelectric conversion section of each pixel on the light-receiving surface 60, causing the photoelectric conversion section to start exposure in a state in which electric charge can be accumulated in the photoelectric conversion section, and then transferring the electric charge accumulated in the photoelectric conversion section to the floating diffusion at the timing at which a predetermined time has elapsed, thereby terminating the exposure of the photoelectric conversion section.

In a case where the actual imaging control is performed, the first imaging signal, which is the imaging signal corresponding to the electric charge accumulated in the photoelectric conversion section of each pixel 61 through the actual imaging, is stored in the storage section 52. Hereinafter, the set of the first imaging signals is also referred to as an actually captured image signal.

The temporary imaging control is control for controlling the driving circuit 63 after the actually captured image signal is stored in the storage section 52 through the actual imaging control described above. Thereby, under an exposure condition different from the actual imaging, the sensor section 51 performs the temporary imaging which is an imaging for determining the imaging condition at actual imaging subsequent to the actual imaging. Through this temporary imaging, an imaging signal corresponding to the electric charge accumulated in each of some pixels 61 (pixels 61 in the field F1 in this case) of all the pixels 61 is output from the sensor section 51.

In a case where the temporary imaging control is performed, the storage section 52 stores the second imaging signal which is an imaging signal corresponding to the electric charge accumulated in the photoelectric conversion section of each pixel 61 in the field F1 through the temporary imaging. Hereinafter, the set of the second imaging signals is also referred to as a temporarily captured image signal.

Here, the exposure condition means at least one of the exposure time of the imaging, the value of the gain multiplied to the imaging signal, or the F number of the stop 2 at the imaging.

The signal output controller 11B controls the control circuit of the storage section 52 so as to control the imaging element 5 such that the imaging element 5 outputs the imaging signal stored in the storage section 52 through the imaging control performed by the imaging controller 11A.

Regarding the actually captured image signal stored in the storage section 52, the signal output controller 11B divides the actually captured image signal into a plurality of groups and sequentially outputs the signal from the imaging element 5 for each group.

Specifically, the signal output controller 11B divides the actually captured image signal into a group GF1, a group GF2, a group GF3, and a group GF4, and sequentially outputs these four groups from the imaging element 5 to the data bus 25. The group GF1 consists of the first imaging signals corresponding to the electric charges accumulated in the pixels 61 in the field F1. The group GF2 consists of the first imaging signals corresponding to the electric charges accumulated in the pixels 61 in the field F2. The group GF3 consists of the first imaging signals corresponding to the electric charges accumulated in the pixels 61 in the field F3. The group GF4 consists of the first imaging signals corresponding to the electric charges accumulated in the pixels 61 in the field F4.

The imaging condition determination section 11C determines an imaging condition at the subsequent actual imaging on the basis of at least the second imaging signal of the first imaging signal which is output from the imaging element 5 by the signal output controller 11B and the second imaging signal which is output from the imaging element 5 by the signal output controller 11B.

It should be noted that the imaging controller 11A continuously performs the temporary imaging control during a period from when at least the group GF1 of the group GF1, the group GF2, the group GF3, and the group GF4 is output from the imaging element 5 until all the groups are output from the imaging element 5.

Figure 5:
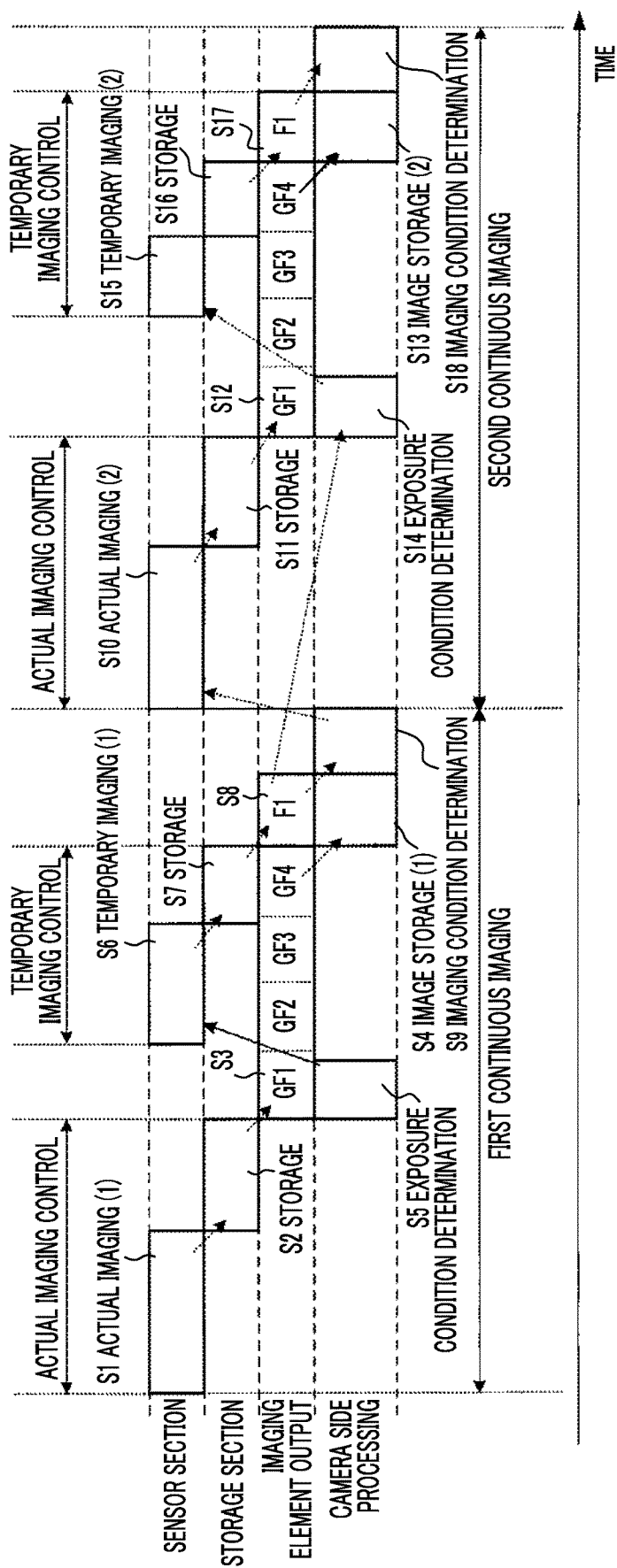
FIG. 5 is a timing chart schematically illustrating operations in a continuous imaging mode of the digital camera illustrated in FIG. 1.

FIG. 5 is a timing chart schematically illustrating operations in the continuous imaging mode of the digital camera illustrated in FIG. 1.

In FIG. 5, timings of operations of the actual imaging and operations of the temporary imaging performed by the sensor section 51 are illustrated in the row of the "sensor section".

In FIG. 5, timings, at which the actually captured image signals and the temporarily captured image signals are stored in the storage section 52, are illustrated in the row of the "storage section".

In FIG. 5, output states of the imaging signals from the imaging element 5 are illustrated in the row of the "imaging element output".

In FIG. 5, processing performed by the system controller 11 and processing performed by the digital signal processing section 17 are illustrated in the row of the "camera side processing".

In a case where an imaging instruction is issued, the first actual imaging control is performed by the imaging controller 11A, and the actual imaging is performed by the sensor section 51 under a first imaging condition (step S1).

Then, a signal corresponding to the electric charge accumulated in each pixel 61 in this actual imaging (referred to as an actually captured image signal G1) is stored in the storage section 52 (step S2).

The imaging conditions include the above-mentioned exposure condition and the in-focus position (the position of the focus lens) of the imaging optical system.

Although not illustrated in FIG. 5, until an imaging instruction is issued after setting of the continuous imaging mode, in order to display a live view image, the system controller 11 causes the sensor section 51 to perform imaging for live view and continuously performs live view imaging control. The live view imaging control is control for causing the sensor section 51 to output an imaging signal corresponding to the electric charge accumulated in each of some pixels 61 (for example, the pixels 61 in the field F1) of all the pixels 61 through the live view imaging.

Then, the system controller 11 causes the imaging element 5 to output the captured image signal (a set of imaging signals which are output from the pixels 61 in the field F1) stored in the storage section 52 through each live view imaging control.

Then, the digital signal processing section 17 generates a live view image on the basis of the captured image signal and causes the display section 23 to display the image.

The imaging controller 11A performs photometry (calculation of the brightness of the subject) and distance measurement (calculation of the phase difference) on the basis of one or a plurality of captured image signals which are output from the imaging element 5 through the live view imaging control before the imaging instruction is issued, and determines the first imaging condition on the basis of the results of the photometry and the distance measurement.

In a case where the storage of the actually captured image signal G1 in the storage section 52 is completed, under the control of the signal output controller 11B, the group GF1 of the actually captured image signal G1 stored in the storage section 52 is sequentially output from the imaging element 5. In a case where the output of the group GF1 is completed, the group GF2 is sequentially output from the imaging element 5. In a case where the output of the group GF2 is completed, the group GF3 is sequentially output from the imaging element 5. In a case where output of the group GF3 is completed, the group GF4 is sequentially output from the imaging element 5 (step S3).

In a case where the output of the group GF4 is completed, the digital signal processing section 17 processes the output actually captured image signal G1 so as to generate captured image data, and stores the generated captured image data in the storage medium 21 (step S4).

On the other hand, in a case where step S3 starts, the imaging controller 11A determines the exposure condition suitable to perform the photometry and the distance measurement on the basis of one or a plurality of captured image signals which are output from the imaging element 5 through the live view imaging control before the imaging instruction is issued (step S5).

Then, in a case where the output of the group GF1 is completed in the course of the output of the actually captured image signal G1 from the imaging element 5, the imaging controller 11A performs the temporary imaging control and the temporary imaging control so as to cause the sensor section 51 performs the temporary imaging under a second imaging condition (step S6).

It should be noted that the imaging controller 11A sets the exposure condition of the second imaging condition as the exposure condition determined in step S5 and sets such that the in-focus position of the second imaging condition is the same as that at the actual imaging in step S1.

Through the temporary imaging in step S6, a signal (assumed to be the temporarily captured image signal g1) corresponding to the electric charge accumulated in each pixel 61 in the field F1 is stored in the storage section 52 (step S7).

In a case where the storage of the temporarily captured image signal g1 in the storage section 52 is completed, under the control of the signal output controller 11B, the temporarily captured image signal g1 stored in the storage section 52 is sequentially output from the imaging element 5 (step S8).

In a case where the output of the temporarily captured image signal g1 is completed, the imaging condition determination section 11C performs the photometry and the distance measurement on the basis of the temporarily captured image signal g1 and determines a third imaging condition of the subsequent actual imaging (the actual imaging (2) in FIG. 5) on the basis of the results of the photometry and the distance measurement (step S9).

In a case where the third imaging condition is determined, the second actual imaging control is performed by the imaging controller 11A, and the actual imaging is performed by the sensor section 51 under the third imaging condition (step S10).

Then, a signal corresponding to the electric charge accumulated in each pixel 61 in this actual imaging (referred to as an actually captured image signal G2) is stored in the storage section 52 (step S11).

In a case where the storage of the actually captured image signal G2 in the storage section 52 is completed, under the control of the signal output controller 11B, the group GF1 of the actually captured image signal G2 stored in the storage section 52 is sequentially output from the imaging element 5. In a case where the output of the group GF1 is completed, the group GF2 is sequentially output from the imaging element 5. In a case where the output of the group GF2 is completed, the group GF3 is sequentially output from the imaging element 5. In a case where output of the group GF3 is completed, the group GF4 is sequentially output from the imaging element 5 (step S12).

In a case where the output of the group GF4 is completed, the digital signal processing section 17 processes the output actually captured image signal G2 so as to generate captured image data, and stores the generated captured image data in the storage medium 21 (step S13).

On the other hand, in a case where step S12 starts, the imaging controller 11A determines the exposure conditions suitable for the photometry and the distance measurement on the basis of the temporarily captured image signal g1 obtained in step S8, and determines the determined exposure condition as the exposure condition at temporary imaging (step S14).

In the course of the processing of step S12, in a case where the output of the group GF1 is completed, the imaging controller 11A performs the temporary imaging control, and causes the sensor section 51 to perform the temporary imaging under a fourth imaging condition (step S15).

The exposure condition determined in step S14 is set as the exposure condition of the fourth imaging condition. The in-focus position in the fourth imaging condition is set to be the same as that in the actual imaging in step S10.

Then, through the temporary imaging, a signal (assumed to be the temporarily captured image signal g2) corresponding to the electric charge accumulated in each pixel 61 in the field F1 is stored in the storage section 52 (step S16).

In a case where the storage of the temporarily captured image signal g2 in the storage section 52 is completed, under the control of the signal output controller 11B, the temporarily captured image signal g2 stored in the storage section 52 is sequentially output from the imaging element 5 (step S17).

In a case where the output of the temporarily captured image signal g2 is completed, the imaging condition determination section 11C performs the photometry and the distance measurement on the basis of the temporarily captured image signal g2 and determines the imaging condition of the subsequent actual imaging on the basis of the results of the photometry and the distance measurement (step S18). Thereafter, the same processing as that of the steps S10 to S18 is repeated.

As described above, in the digital camera of FIG. 1, the imaging condition at the second actual imaging performed in the continuous imaging mode is determined on the basis of the temporarily captured image signal g1 obtained through the first temporary imaging (step S6).

The temporarily captured image signal g1 is obtained by performing the temporary imaging under an appropriate exposure condition for determining the imaging condition.

Therefore, the imaging condition at the second actual imaging can be made appropriate, and the imaging quality can be improved.

The temporary imaging (step S6) for acquiring the temporarily captured image signal g1 is performed during a period in which the actually captured image signal G1 obtained by the first actual imaging is output from the imaging element 5. For this reason, it is possible to shorten the interval between the actual imaging and the actual imaging, and it is possible to perform high-speed continuous imaging.

In FIG. 5, the timing of starting the temporary imaging control (the timing of start of step S6 (step S15)) is the time at which step S7 (step S16) starts. The timing may be any time after the end of step S2 (step S11) in a case where there is a space enough to store the temporarily captured image signal in the storage section 52.

In FIG. 5, the period, in which step S3 (step S12) is performed, is shortened for convenience, but this period is sufficiently longer than the period in which the temporary imaging control is performed.

For example, step S7 (step S16) may be completed at the time at which the output of the group GF2 is completed in step S3 (step S12). In such a case, the processing of step S8 (step S17) can be performed at a time prior to the start of the output of the group GF3 or group GF4 in step S3 (step S12).

In this manner, by outputting the temporarily captured image signal before the output start of the group GF4 of the actually captured image signal, it is possible to promptly perform the processing of determining the imaging condition at the subsequent actual imaging (step S9 (step S18)). As a result, it is possible to shorten the time to start the subsequent actual imaging and further shorten the continuous imaging interval.

The determination of the exposure condition at the temporary imaging in step S14 is performed on the basis of the temporarily captured image signal g1 obtained through the temporary imaging in step S6. Therefore, it is unnecessary to perform another temporary imaging for determining this exposure condition between step S6 and step S10, and it is possible to shorten the continuous imaging interval.

It should be noted that, in step S14, the imaging controller 11A may determine the exposure condition of the temporary imaging performed in step S15 on the basis of the temporarily captured image signal g1 and the actually captured image signal G1 obtained in the actual imaging in step S1. According to this configuration, it is possible to determine the exposure condition of the temporary imaging by using more information, and it is possible to determine this exposure condition with higher accuracy.

For example, the imaging controller 11A compares the exposure value based on the actually captured image signal G1 with the exposure value based on the temporarily captured image signal g1. In a case where the difference therebetween is small, the exposure value based on the temporarily captured image signal g1 or an average value of the exposure value based on the actually captured image signal G1 and the exposure value based on the temporarily captured image signal g1 is determined as the exposure condition at the subsequent temporary imaging.

In a case where the difference between the two is large, the imaging controller 11A determines the exposure value based on the temporarily captured image signal g1 as the exposure condition at the subsequent temporary imaging.

Further, in step S9 or S18, the imaging condition determination section 11C may determine the imaging condition on the basis of the actually captured image signal and the temporarily captured image signal respectively obtained by the actual imaging control and the temporary imaging control immediately before this processing. According to this configuration, it is possible to determine the imaging condition for the actual imaging with high accuracy.

For example, the imaging condition determination section 11C determines the in-focus position at the actual imaging on the basis of a phase difference having higher reliability of the calculation result of the phase difference using the actually captured image signal and the calculation result of the phase difference using the temporarily captured image signal or the average value of these two phase differences.

The imaging condition determination section 11C compares the exposure determined using the actually captured image signal with the exposure determined using the temporarily captured image signal. In a case where the difference therebetween is small, the average value of the two exposures is determined as the exposure at the actual imaging. In a case where the difference between the two exposures is large, the exposure determined using the temporarily captured image signal is determined as the exposure at the actual imaging.

Alternatively, the imaging condition determination section 11C predicts a position of the main subject (subject to be focused) at the subsequent actual imaging by comparing the calculation result of the phase difference using the actually captured image signal with the calculation result of the phase difference using the temporarily captured image signal. Then, the imaging condition determination section 11C determines the imaging condition by performing the photometry and the distance measurement on the basis of a signal, which is obtained through the imaging of the predicted main subject, among the temporarily captured image signals.

Figure 6:
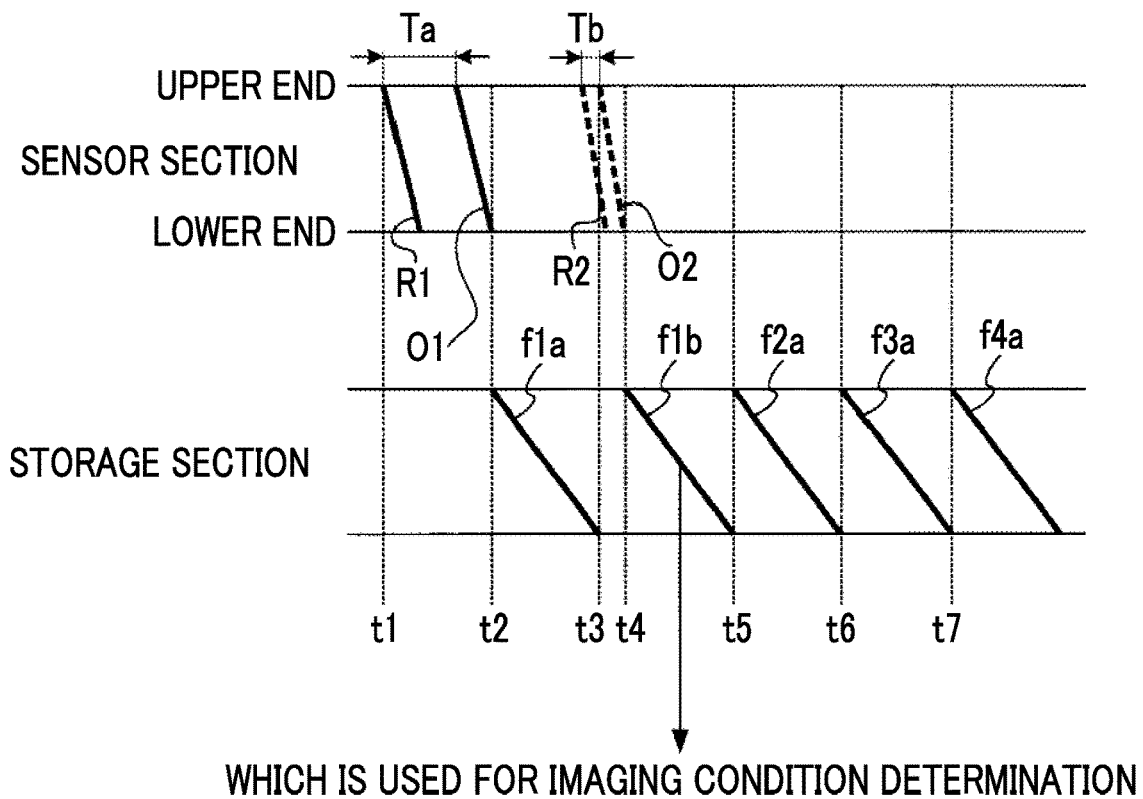
FIG. 6 is a timing chart illustrating in detail a first example of the operations in the continuous imaging mode of the digital camera illustrated in FIG. 1.

FIG. 6 is a timing chart illustrating in detail a first example of the operations in the continuous imaging mode of the digital camera illustrated in FIG. 1.

FIG. 6 shows the operations in a case where the imaging controller 11A performs the imaging control including the actual imaging control and the temporary imaging control for performing the temporary imaging with the shorter exposure time than the actual imaging through the actual imaging control.

FIG. 6 shows, in the row of the "sensor section", straight lines R1 and R2, which indicate the reset timing of the photoelectric conversion sections included in the pixels 61 of the respective pixel rows 62 on the light-receiving surface 60, and straight lines O1 and O2 which indicate the read timing of the imaging signals from the photoelectric conversion sections.

FIG. 6 shows straight lines f1a, f1b, f2a, f3a, and f4a indicating the output timing of the imaging signal stored in the storage section 52 in the row of the "storage section".

In a case where an imaging instruction is issued, the imaging controller 11A sequentially resets the pixel rows 62 from the upper end side of the light-receiving surface 60 at the time t1, thereby starting the exposure of the actual imaging performed by the sensor section 51 (the straight line R1 of FIG. 6).

In a case where a predetermined exposure time Ta elapses from the start of exposure of each pixel row 62, the imaging controller 11A transfers the electric charge accumulated in each photoelectric conversion section of this pixel row 62 to the floating diffusion, terminates the exposure of pixel row 62, and outputs a voltage signal corresponding to the transferred electric charge from the sensor section 51 (the straight line O1 in FIG. 6).

In a case where the actually captured image signal composed of the imaging signals output from the sensor section 51 is stored in the storage section 52 (the time t2), the signal output controller 11B sequentially outputs the imaging signals, which are output from the pixels 61 in the field F1 in the actually captured image signal, from the storage section 52 to the data bus 25 (the straight line f1a in FIG. 6).

The imaging controller 11A sequentially resets the pixel rows 62 of the field F1 from the upper end side of the light-receiving surface 60 during the period of output of the imaging signals, which are output from the pixels 61 in the field F1, from the imaging element 5. In such a manner, the exposure of the temporary imaging performed by the sensor section 51 starts (the straight line R2 in FIG. 6). In this case, the F number of the stop 2 is the same between the actual imaging and the temporary imaging.

In a case where a predetermined exposure time Tb (<exposure time Ta) elapses from the start of the exposure of the temporary imaging in each pixel row 62 of the field F1, the imaging controller 11A transfers the electric charge accumulated in each photoelectric conversion section of this pixel row 62 to the floating diffusion, terminates the exposure of pixel row 62, and outputs an imaging signal corresponding to the transferred electric charge from the sensor section 51 (the straight line O2 in FIG. 6).

It should be noted that the timing of completion of the output of the imaging signal according to the straight line f1a (the time t3) and the timing of start of the output of the imaging signal from the sensor section 51 according to the straight line O2 coincide with each other. However, the present invention is not limited to this. The timing of start of exposure of the temporary imaging may be determined such that the output of the imaging signal according to the straight line O2 from the sensor section 51 starts after the time t3.

The temporarily captured image signal composed of the imaging signals output from the sensor section 51 at the straight line O2 is overwritten on the storage area of the imaging signals output at the straight line f1a in the actually captured image signal.

In a case where the temporarily captured image signal is stored in the storage section 52 at the time t4, the signal output controller 11B sequentially outputs the temporarily captured image signal from the storage section 52 to the data bus 25 (the straight line f1b in FIG. 6).

In a case where the output of the imaging signal according to the straight line f1b from the imaging element 5 is completed at the time t5, the signal output controller 11B sequentially outputs the imaging signals, which are output from the pixels 61 in the field F2 in the actually captured image signal, from the storage section 52 to the data bus 25 (the straight line f2a in FIG. 6).

In a case where the output of the imaging signal by the straight line f2a from the imaging element 5 is completed at the time t6, the signal output controller 11B sequentially outputs the imaging signals, which are output from the pixels 61 in the field F3 in the actually captured image signal, from the storage section 52 to the data bus 25 (the straight line f3a in FIG. 6).

In a case where the output of the imaging signal according to the straight line f3a from the imaging element 5 is completed at the time t7, the signal output controller 11B sequentially outputs the imaging signals, which are output from the pixels 61 in the field F4 in the actually captured image signal, from the storage section 52 to the data bus 25 (the straight line f4a in FIG. 6).

According to the above operation example, the imaging condition at the subsequent actual imaging can be determined at the time t5. Therefore, it is possible to start the subsequent actual imaging immediately after the output of the imaging signal according to the straight line f4a from the imaging element 5 is completed, and it is possible to shorten the continuous imaging interval.

Figure 7:
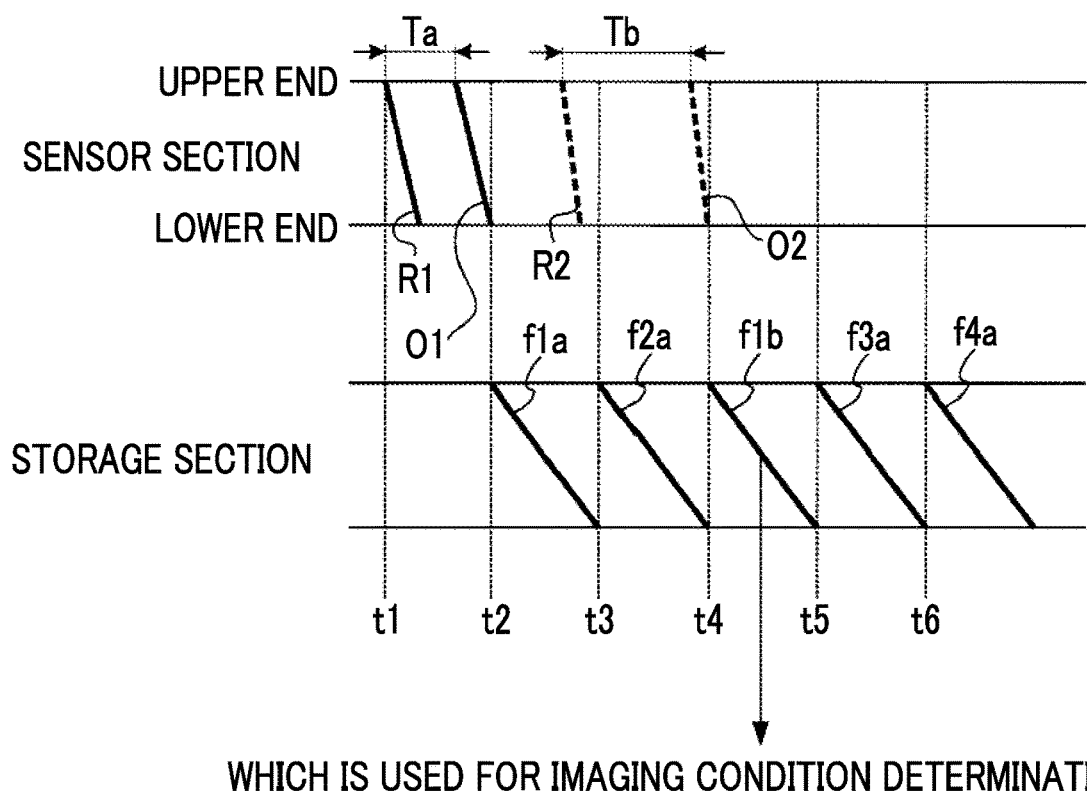
FIG. 7 is a timing chart illustrating in detail a second example of the operations in the continuous imaging mode of the digital camera illustrated in FIG. 1.

FIG. 7 is a timing chart illustrating in detail the second example of the operations in the continuous imaging mode of the digital camera illustrated in FIG. 1.

In a case where an imaging instruction is issued, the imaging controller 11A sequentially resets the pixel rows 62 from the upper end side of the light-receiving surface 60 at the time t1, thereby starting the exposure of the actual imaging performed by the sensor section 51 (the straight line R1 of FIG. 7).

In a case where a predetermined exposure time Ta elapses from the start of exposure of each pixel row 62, the imaging controller 11A transfers the electric charge accumulated in each photoelectric conversion section of this pixel row 62 to the floating diffusion, terminates the exposure of pixel row 62, and outputs a voltage signal corresponding to the transferred electric charge from the sensor section 51 (the straight line O1 in FIG. 7).

In a case where the actually captured image signal composed of the imaging signals output from the sensor section 51 is stored in the storage section 52 (the time t2), the signal output controller 11B sequentially outputs the imaging signals, which are output from the pixels 61 in the field F1 in the actually captured image signal, from the storage section 52 to the data bus 25 (the straight line f1a in FIG. 7).

The imaging controller 11A sequentially resets the pixel rows 62 of the field F1 from the upper end side of the light-receiving surface 60 during the period of output of the imaging signals, which are output from the pixels 61 in the field F1, from the imaging element 5. In such a manner, the exposure of the temporary imaging performed by the sensor section 51 starts (the straight line R2 in FIG. 7). It should be noted that the F number of the stop 2 is the same between the actual imaging and the temporary imaging.

In a case where the output of the imaging signal according to the straight line f1a from the imaging element 5 is completed (the time t3), the signal output controller 11B sequentially outputs the imaging signals, which are output from the pixels 61 in the field F2 in the actually captured image signal, from the storage section 52 to the data bus 25 (the straight line f2a in FIG. 7).

The predetermined exposure time Tb elapses after the exposure of the temporary imaging of each pixel row 62 in the field F1 starts during the period of output of the imaging signals output from the pixels 61 in the field F2 of the actually captured image signal.

The imaging controller 11A transfers the electric charge, which is accumulated in each photoelectric conversion section of the pixel row 62 of the field F1 after the exposure time Tb elapses, to the floating diffusion, terminates the exposure of this pixel row 62, and outputs a voltage signal corresponding to the transferred electric charge from the sensor section 51 (the straight line O2 in FIG. 7).

The temporarily captured image signal composed of the imaging signals output from the sensor section 51 at the straight line O2 is overwritten on the storage area of the imaging signals output at the straight line f1a in the actually captured image signal.

In a case where the temporarily captured image signal is stored in the storage section 52 and the output of the imaging signal according to the straight line f2a is completed (the time t4), the signal output controller 11B outputs the temporarily captured image signal from the storage section 52 to the data bus 25 (the straight line f1b in FIG. 7).

In a case where the output of the imaging signal according to the straight line f1b from the imaging element 5 is completed (the time t5), the signal output controller 11B sequentially outputs the imaging signals, which are output from the pixels 61 in the field F3 in the actually captured image signal, from the storage section 52 to the data bus 25 (the straight line f3a in FIG. 7).

In a case where the output of the imaging signal by the straight line f3a from the imaging element 5 is completed (the time t6), the signal output controller 11B sequentially outputs the imaging signals, which are output from the pixels 61 in the field F4 in the actually captured image signal, from the storage section 52 to the data bus 25 (the straight line f4a in FIG. 7).

According to the above operation example, the imaging condition at the subsequent actual imaging can be determined at the time t5. Therefore, it is possible to start the subsequent actual imaging immediately after the output of the imaging signal according to the straight line f4a from the imaging element 5 is completed, and it is possible to shorten the continuous imaging interval.

In the above description, the imaging controller 11A performs the temporary imaging control once between the actual imaging control and the actual imaging control. As a modification example, the imaging controller 11A may perform temporary imaging control a plurality of times between the actual imaging control and the actual imaging control.

In this case, the imaging condition determination section 11C determines the imaging condition at optional actual imaging on the basis of at least a plurality of temporarily captured image signals among the actually captured image signal, which is obtained through the actual imaging control immediately before this actual imaging and the plurality of temporarily captured image signals which are respectively obtained through a plurality of operations of the temporary imaging control immediately before this actual imaging. An example of a method of determining the imaging condition will be described below.

(1) A phase difference is calculated by each of the plurality of temporarily captured image signals, and the in-focus position at the actual imaging is determined on the basis of the phase difference having the highest reliability among these phase differences. Photometry is performed by each of a plurality of temporarily captured image signals, and the exposure at the actual imaging is determined on the basis of the plurality of photometry results.

(2) A phase difference is calculated on the basis of the actually captured image signal, a phase difference is calculated by each of the plurality of temporarily captured image signals, and the in-focus position at the actual imaging is determined on the basis of the phase difference having the highest reliability among the phase differences.

(3) A phase difference is calculated by each of the plurality of temporarily captured image signals, and the position of the main subject at the subsequent actual imaging is predicted by comparing the phase differences. The photometry and the distance measurement are performed on the basis of a signal of an area, in which the predicted subject is imaged, among the temporarily captured image signals. Thereby, the imaging condition at the actual imaging is determined.

(4) A phase difference is calculated by using all captured image signals including the actually captured image signal and the plurality of temporarily captured image signals. By comparing the phase differences, the position of the main subject at the subsequent actual imaging is predicted. The photometry and the distance measurement are performed on the basis of a signal of an area in which the predicted main subject is imaged in the temporarily captured image signal. Thereby, the imaging condition at the actual imaging is determined.

Figure 8:
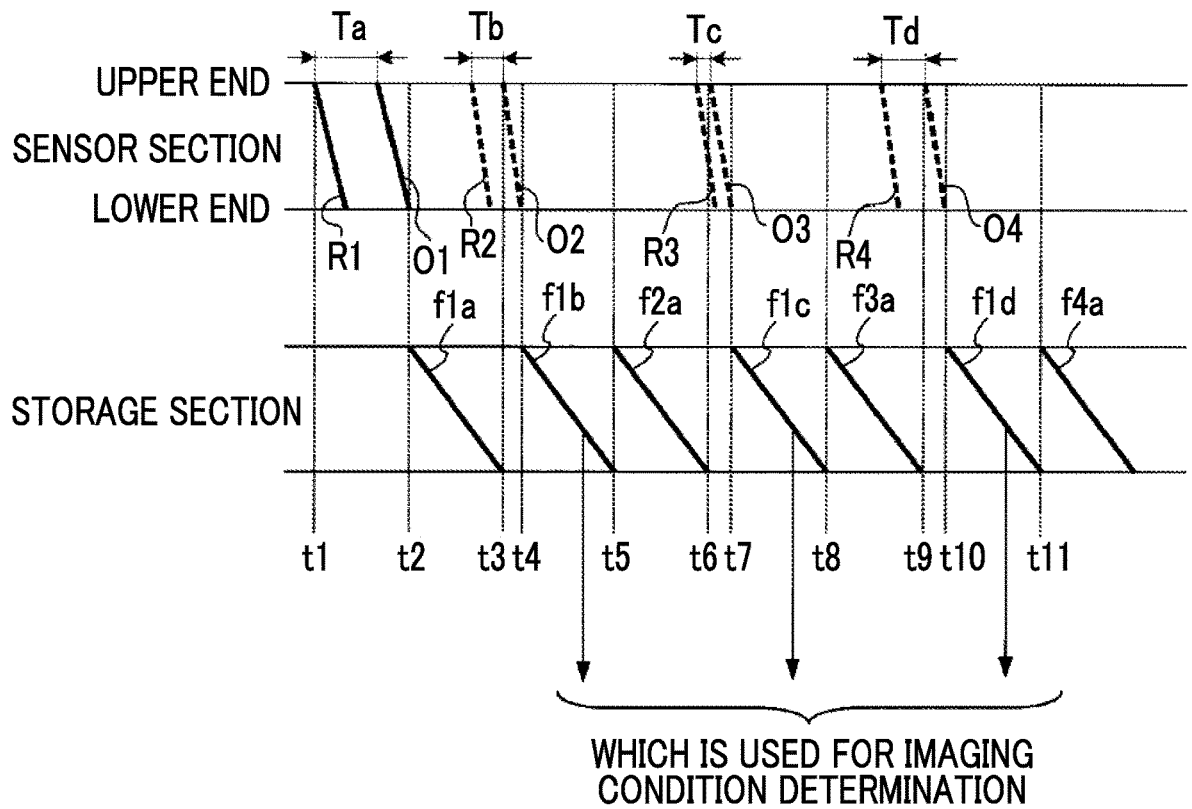
FIG. 8 is a timing chart illustrating in detail a third example of the operations in the continuous imaging mode of the digital camera illustrated in FIG. 1.

FIG. 8 is a timing chart illustrating in detail a third example of the operations in the continuous imaging mode of the digital camera illustrated in FIG. 1. FIG. 8 shows one operation of the imaging control in a case where the imaging controller 11A continuously performs operations of the imaging control including an operation of the actual imaging control and three operations of the temporary imaging control.

FIG. 8 shows, in the row of the "sensor section", straight lines R1, R2, R3, and R4, which indicate the reset timings of the photoelectric conversion sections included in the pixels 61 of the respective pixel rows 62 on the light-receiving surface 60, and straight lines O1, O2, O3, and O4 which indicate the read timings of the imaging signals from the photoelectric conversion sections.

FIG. 8 shows straight lines f1a, f1b, f2a, f1c, f3a, f1d, f4a indicating the output timings of the imaging signals stored in the storage section 52 in the row of the "storage section".

In a case where an imaging instruction is issued, the imaging controller 11A sequentially resets the pixel rows 62 from the upper end side of the light-receiving surface 60 at the time t1, thereby starting the exposure of the actual imaging performed by the sensor section 51 (the straight line R1 of FIG. 8).

In a case where a predetermined exposure time Ta elapses from the start of exposure of each pixel row 62, the imaging controller 11A transfers the electric charge accumulated in each photoelectric conversion section of this pixel row 62 to the floating diffusion, terminates the exposure of pixel row 62, and outputs an imaging signal corresponding to the transferred electric charge from the sensor section 51 (the straight line O1 in FIG. 8).

In a case where the actually captured image signal composed of the imaging signals output from the sensor section 51 according to the straight line O1 is stored in the storage section 52 (the time t2), the signal output controller 11B sequentially outputs the imaging signals, which are output from the pixels 61 in the field F1 in the actually captured image signal, from the storage section 52 to the data bus 25 (the straight line f1a in FIG. 6).

The imaging controller 11A sequentially resets the pixel rows 62 of the field F1 from the upper end side of the light-receiving surface 60 during the period of output of the imaging signals according to the straight line f1a. In such a manner, the exposure of the first temporary imaging performed by the sensor section 51 starts (the straight line R2 in FIG. 8).

Then, in a case where a predetermined exposure time Tb elapses from the start of exposure of each pixel row 62 in the field F1, the imaging controller 11A transfers the electric charge accumulated in each photoelectric conversion section of this pixel row 62 to the floating diffusion, terminates the exposure of pixel row 62, and outputs an imaging signal corresponding to the transferred electric charge from the sensor section 51 (the straight line O2 in FIG. 8).

It should be noted that the timing of completion of the output of the imaging signal according to the straight line f1a and the timing of start of the output of the imaging signal from the sensor section 51 according to the straight line O2 coincide with each other. However, the present invention is not limited to this. The timing of start of exposure of the first temporary imaging may be determined such that the output of the imaging signal according to the straight line O2 from the sensor section 51 starts after the time t3.

The temporarily captured image signal composed of the imaging signals output from the sensor section 51 at the straight line O2 is overwritten on the storage area of the imaging signals output at the straight line f1a in the actually captured image signal.

In a case where the storage of the temporarily captured image signal output at the straight line O2 is completed (the time t4), the signal output controller 11B sequentially outputs the temporarily captured image signal, which is stored in the storage section 52, to the data bus 25 (the straight line f1b in FIG. 8).

In a case where the output of the imaging signal according to the straight line f1b from the imaging element 5 is completed (the time t5), the signal output controller 11B sequentially outputs the imaging signals, which are output from the pixels 61 in the field F2 in the actually captured image signal, from the storage section 52 to the data bus 25 (the straight line f2a in FIG. 8).

The imaging controller 11A sequentially resets the pixel rows 62 of the field F1 from the upper end side of the light-receiving surface 60 during the period of output of the imaging signals at the straight line f2a. In such a manner, the exposure of the second temporary imaging performed by the sensor section 51 starts (the straight line R3 in FIG. 8).

Then, in a case where a predetermined exposure time Tc elapses from the start of exposure of each pixel row 62 in the field F1, the imaging controller 11A transfers the electric charge accumulated in each photoelectric conversion section of this pixel row 62 to the floating diffusion, terminates the exposure of pixel row 62, and outputs an imaging signal corresponding to the transferred electric charge from the sensor section 51 (the straight line O3 in FIG. 8).

It should be noted that the timing of completion of the output of the imaging signal according to the straight line f2a and the timing of start of the output of the imaging signal from the sensor section 51 according to the straight line O3 coincide with each other. However, the present invention is not limited to this. The timing of start of exposure of the second temporary imaging may be determined such that the output of the imaging signal according to the straight line O3 from the sensor section 51 starts after the time t6.

The temporarily captured image signal composed of the imaging signals output from the sensor section 51 at the straight line O3 is overwritten on the storage area of the temporarily captured image signal output at the straight line f1b.

In a case where the storage of the temporarily captured image signal output at the straight line O3 is completed (the time t7), the signal output controller 11B sequentially outputs the temporarily captured image signal, which is stored in the storage section 52, to the data bus 25 (the straight line f1c in FIG. 8).

In a case where the output of the imaging signal according to the straight line f1c from the imaging element 5 is completed (the time t8), the signal output controller 11B sequentially outputs the imaging signals, which are output from the pixels 61 in the field F3 in the actually captured image signal, from the storage section 52 to the data bus 25 (the straight line f3a in FIG. 8).

The imaging controller 11A sequentially resets the pixel rows 62 of the field F1 from the upper end side of the light-receiving surface 60 during the period of output of the imaging signals at the straight line f3a. In such a manner, the exposure of the third temporary imaging performed by the sensor section 51 starts (the straight line R4 in FIG. 8).

Then, in a case where a predetermined exposure time Td elapses from the start of exposure of each pixel row 62 in the field F1, the imaging controller 11A transfers the electric charge accumulated in each photoelectric conversion section of this pixel row 62 to the floating diffusion, terminates the exposure of pixel row 62, and outputs an imaging signal corresponding to the transferred electric charge from the sensor section 51 (the straight line O4 in FIG. 8).

It should be noted that the timing of completion of the output of the imaging signal according to the straight line f3a and the timing of start of the output of the imaging signal from the sensor section 51 according to the straight line O4 coincide with each other. However, the present invention is not limited to this. The timing of start of exposure of the third temporary imaging may be determined such that the output of the imaging signal according to the straight line O4 from the sensor section 51 starts after the time t9.

The temporarily captured image signal composed of the imaging signals output from the sensor section 51 at the straight line O4 is overwritten on the storage area of the temporarily captured image signal output at the straight line f1c.

In a case where the storage of the temporarily captured image signal output at the straight line O4 is completed (the time t10), the signal output controller 11B sequentially outputs the temporarily captured image signal, which is stored in the storage section 52, to the data bus 25 (the straight line f1d in FIG. 8).

In a case where the output of the imaging signal by the straight line f1d from the imaging element 5 is completed (the time t11), the signal output controller 11B sequentially outputs the imaging signals, which are output from the pixels 61 in the field F4 in the actually captured image signal, from the storage section 52 to the data bus 25 (the straight line f4a in FIG. 8).

Then, the imaging condition determination section 11C determines the imaging condition at the subsequent actual imaging on the basis of at least three temporarily captured image signals among the actually captured image signal output from the imaging element 5 and the three temporarily captured image signals.

In addition, the imaging controller 11A determines the exposure condition of each of a plurality of operations of the temporary imaging performed after the subsequent actual imaging, on the basis of at least three temporarily captured image signals among the actually captured image signal and the three temporarily captured image signals.

It should be noted that in the example of FIG. 8, the F number of the stop 2 is the same between the actual imaging and the three operations of the temporary imaging. The exposure time Tb, the exposure time Tc, and the exposure time Td are all different values and are different from the exposure time Ta.

As described above, by performing a plurality of operations of the temporary imaging, it is possible to acquire a larger amount of subject information immediately before the actual imaging. In addition, it is possible to more accurately determine the imaging condition at the actual imaging or the exposure conditions at the operations of the temporary imaging performed after this actual imaging.

In particular, as illustrated in FIG. 8, by making the exposure conditions of the plurality of operations of the temporary imaging different from each other, even in a case of capturing an image of a subject whose brightness and distance are changed, it is possible to improve the accuracy in determination of the imaging condition at the actual imaging or the exposure conditions at the operations of the subsequent temporary imaging.

It should be noted that the exposure time Tb, the exposure time Tc, and the exposure time Td may be different from the exposure time Ta, and at least two of the exposure times may be the same value.

In this case, all the exposure conditions of the plurality of operations of the temporary imaging may be the same, but the number of the plurality of exposure conditions is different from the exposure condition at the actual imaging. Therefore, it is possible to determine the imaging condition at the subsequent actual imaging or to determine the exposure condition at the subsequent temporary imaging with high accuracy.

Even in a case where the exposure conditions of the plurality of operations of the temporary imaging are all the same, it is possible to predict movement of the main subject on the basis of the plurality of temporarily captured image signals.

Therefore, by using the movement prediction result of the main subject as the information for determining the in-focus position at the subsequent actual imaging, it is possible to improve the accuracy in determination of the in-focus position at the subsequent actual imaging.

Next, a specific example of the exposure condition of each operation of the temporary imaging in a case of performing a plurality of operations of the temporary imaging will be described.

Figure 9:
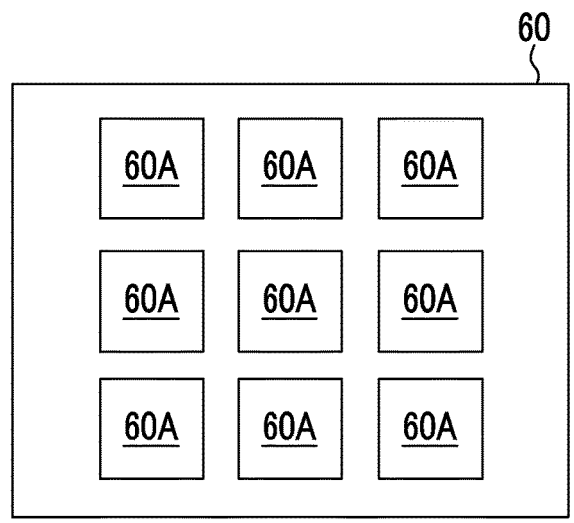
FIG. 9 is a diagram illustrating an example of photometry distance measurement areas 60A which are set on a light-receiving surface 60 of the imaging element 5.

FIG. 9 is a diagram illustrating an example of photometry distance measurement areas 60A which are set on a light-receiving surface 60 of the imaging element 5. As illustrated in FIG. 7, nine photometry distance measurement areas 60A are set on the light-receiving surface 60.

Each photometry distance measurement area 60A indicates an area to be used for determining the exposure condition and the in-focus position, and the system controller 11 performs the photometry and the distance measurement, on the basis of the imaging signals which are output from the pixels 61 in the photometry distance measurement area 60A selected from the nine photometry distance measurement areas 60A.

For example, it is assumed that the first actual imaging is performed in a state in which three photometry distance measurement areas 60A arranged in the row direction X are selected.

In this case, in a case where a subject whose shading largely changes in the row direction X is imaged in these three photometry distance measurement areas 60A, in accordance with the photometry distance measurement area 60A, in some cases, the exposure value at actual imaging may not be enough for a level at which the photometry or the distance measurement is performed with high accuracy.

Therefore, the imaging controller 11A performs the temporary imaging control corresponding to each of the selected three photometry distance measurement areas 60A.

Specifically, the imaging controller 11A sets the exposure conditions at the operations of the temporary imaging performed corresponding to the selected photometry distance measurement areas 60A as an exposure condition where the exposure value of the photometry distance measurement area 60A is set as a predetermined exposure value (a value at which the photometry and the distance measurement can be accurately performed).

As described above, in the case where the plurality of photometry distance measurement areas 60A are selected, the temporary imaging is performed such that the exposure of each photometry distance measurement area 60A becomes appropriate. Thereby, it is possible to improve the accuracies of the photometry and the distance measurement using the imaging signals which are output from all the selected photometry distance measurement areas 60A.

It should be noted that the imaging controller 11A may perform twice or more the temporary imaging control so as to correspond to each of the selected three photometry distance measurement areas 60A.

In such a manner, it is possible to further enhance the accuracies of the photometry and the distance measurement using the imaging signals output from all the selected photometry distance measurement areas 60A.

In the imaging controller 11A, it is preferable that as the continuous imaging interval set by a user in the continuous imaging mode (the time from the start of the actual imaging until the start of the subsequent actual imaging) is larger, the upper limit value of the number of operations of the temporary imaging subsequent to the actual imaging is set to be larger.

According to this configuration, in a case where the continuous imaging interval is short, the number of operations of the temporary imaging control is small. As a result, high-speed continuous imaging can be realized. In addition, in a case where the continuous imaging interval is long, the number of operations of the temporary imaging control is large. As a result, it is possible to improve the accuracy in determination of the imaging condition.

In a case where the upper limit value of the number of operations of the temporary imaging control is controlled as described above, a plurality of photometry distance measurement areas 60A may be selected. In this case, it is assumed that the number of operations of the temporary imaging control is set to be less than the number of selected photometry distance measurement areas 60A.

For example, it is assumed that all the nine photometry distance measurement areas 60A are selected, and the number of operations of the temporary imaging control included in the imaging control is limited to two.

In this case, the imaging controller 11A estimates an area of the light-receiving surface 60, on which a subject to be focused at the latest unapplied actual imaging is imaged, on the basis of the information about the main subject focused at the previous actual imaging, and performs temporary imaging control corresponding to at least the photometry distance measurement area 60A, which include the estimated area, among the nine photometry distance measurement areas 60A.

Figure 10:
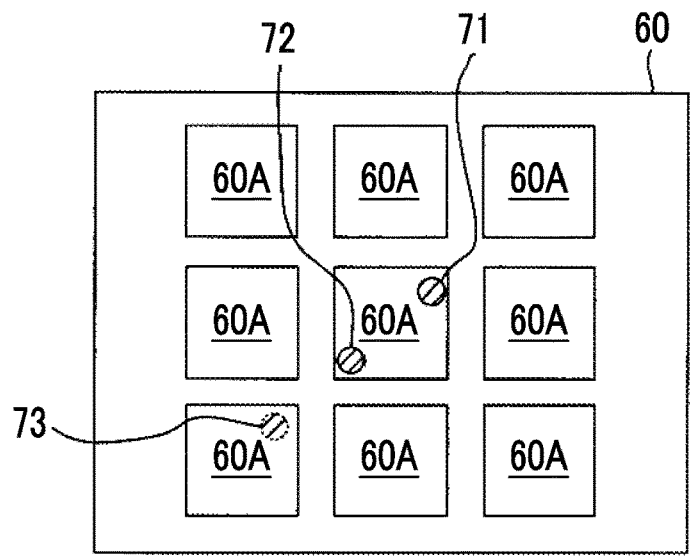
FIG. 10 is a diagram for explaining operations in a case where the number of operations of temporary imaging control is less than the number of the selected photometry distance measurement areas 60A.

For example, as illustrated in FIG. 10, the imaging controller 11A detects the position of the main subject 71, which was focused at the actual imaging previous by two operations to the latest actual imaging, at the time the latest actual imaging is not yet performed, on the basis of the actually captured image signal obtained through the actual imaging previous by two operations thereto.

Further, the imaging controller 11A detects the position of the main subject 72, which was focused at the actual imaging immediately previous to the above-mentioned latest actual imaging, on the basis of the actually captured image signal obtained through the immediately previous actual imaging.

The imaging controller 11A predicts the position of the main subject 73 to be focused at the latest actual imaging, on the basis of the position of the main subject 71 and the position of the main subject 72.

Then, the imaging controller 11A performs, as the temporary imaging control performed after the latest actual imaging, at least the temporary imaging control corresponding to the photometry distance measurement area 60A including the position of the main subject 73 on the lower left in FIG. 10.

It should be noted that the imaging controller 11A may perform, as the temporary imaging control performed after the latest actual imaging, two operations of temporary imaging control including temporary imaging control, which corresponds to the photometry distance measurement area 60A including the position of the main subject 72 in the middle of FIG. 10, and temporary imaging control which corresponds to the photometry distance measurement area 60A including the position of the main subject 73 on the lower left in FIG. 10.

According to this configuration, even in the case where the continuous imaging interval is shortened and the number of operations of the temporary imaging control is limited, at least the temporary imaging can be performed such that the photometry distance measurement area 60A, in which it is predicted that a main subject is imaged, is appropriately exposed. Thus, it is possible to improve the accuracy in determination of the imaging condition at the actual imaging subsequent to the latest actual imaging even with a small number of operations of the temporary imaging.

The digital camera has been hitherto taken as an example of an imaging apparatus, but in the following description, an embodiment of a smartphone having a camera as an imaging apparatus will be described.

Figure 11:
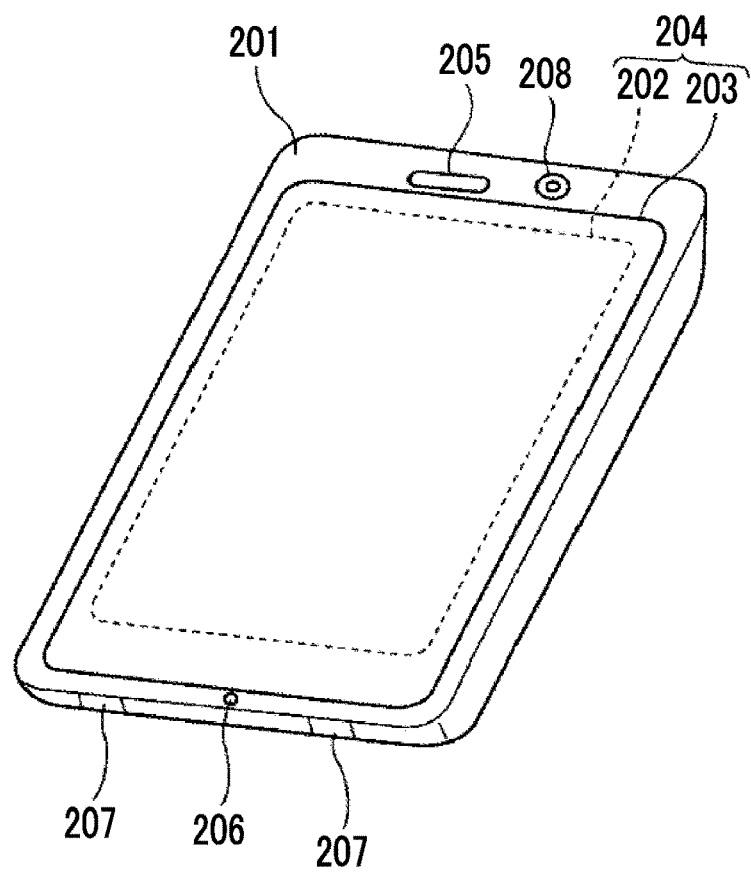
FIG. 11 is a diagram illustrating an appearance of a smartphone 200 which is an embodiment of an imaging apparatus according to an embodiment of the present invention.

FIG. 11 shows an appearance of a smartphone 200 as an imaging apparatus according to the above-mentioned embodiment of the present invention.

The smartphone 200 illustrated in FIG. 11 comprises: a housing 201 that has a flat plate shape; a display panel 202 as a display section on one side of the housing 201; and a display input section 204 into which an operation panel 203 as an input section is integrated.

Further, the housing 201 comprises a speaker 205, a microphone 206, operation sections 207, and a camera section 208.

It should be noted that the configuration of the housing 201 is not limited to this. For example, it may be possible to adopt a configuration in which the input section and the display section are independent, or it may be possible to adopt a configuration having a slide mechanism or a folded structure.

Figure 12:
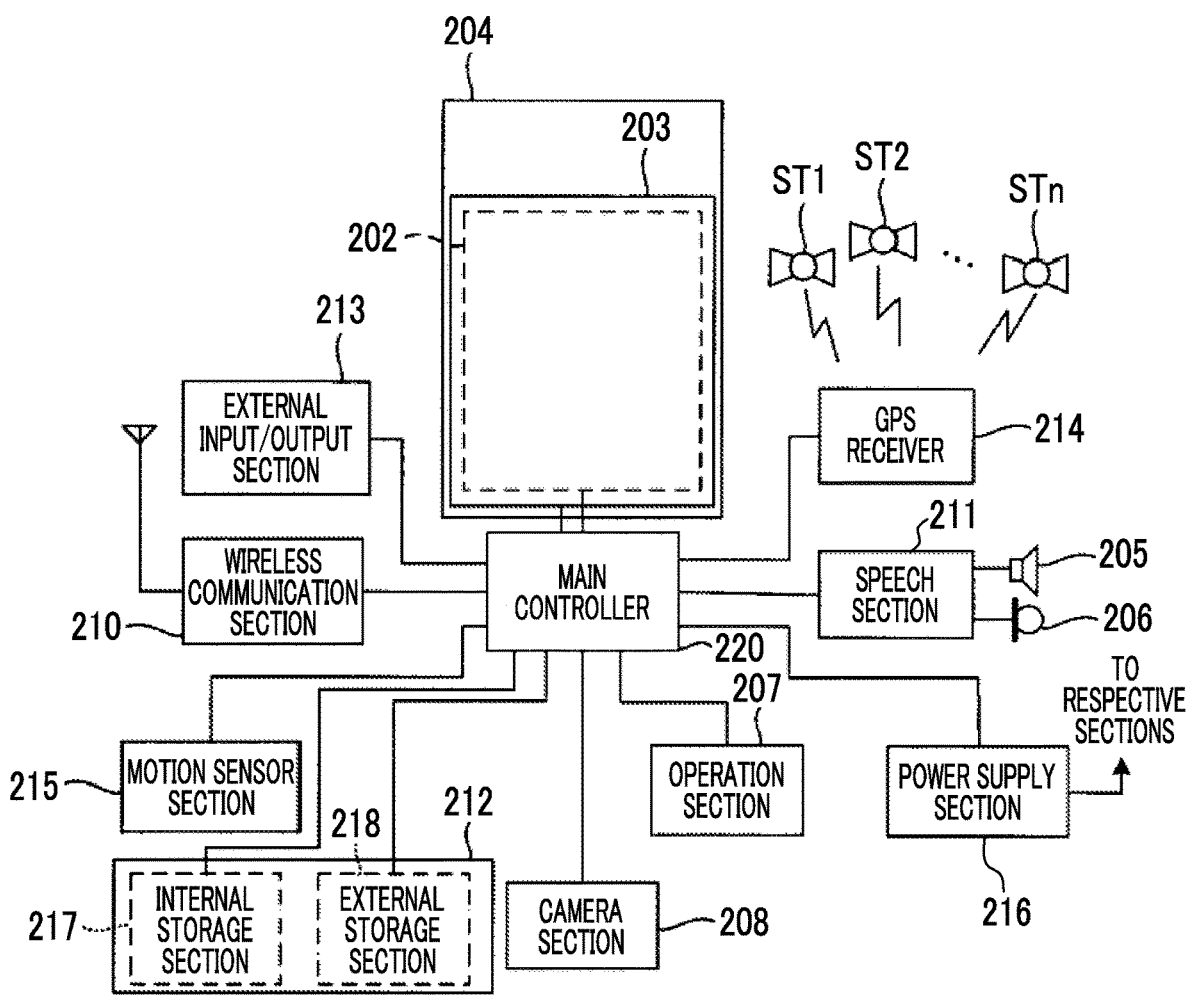
FIG. 12 is a block diagram illustrating a configuration of the smartphone 200 illustrated in FIG. 11.

FIG. 12 is a block diagram illustrating a configuration of the smartphone 200 illustrated in FIG. 11.

As illustrated in FIG. 12, the smartphone comprises, as main components, a wireless communication section 210, a display input section 204, a speech section 211, the operation sections 207, the camera section 208, a storage section 212, an external input/output section 213, a global positioning system (GPS) receiver 214, a motion sensor section 215, a power supply section 216, and a main controller 220.

As the main function of the smartphone 200, there is provided a wireless communication function for performing mobile wireless communication with a base station device BS, which is not shown, through a mobile communication network NW which is not shown.

The wireless communication section 210 performs wireless communication with the base station device BS, which is included in the mobile communication network NW, in accordance with an instruction of the main controller 220. The wireless communication is used to transmit and receive various kinds of file data such as audio data and image data, and e-mail data or to receive web data, streaming data, or the like.

The display input section 204 is a so-called touch panel, and includes the display panel 202 and the operation panel 203. The touch panel displays image (still image and moving image) information, text information, or the like so as to visually transfer the information to a user in accordance with control of the main controller 220, and detects a user operation on the displayed information.

The display panel 202 uses a liquid crystal display (LCD), an organic electro-luminescence display (OELD), or the like as a display device.

The operation panel 203 is a device that is provided for viewing an image which is displayed on a display screen of the display panel 202 and that detects a single pair of coordinates or a plurality of pairs of coordinates at which an operation is performed by a user's finger or a stylus. In a case where such a device is operated by a user's finger or a stylus, the device outputs a detection signal, which is generated due to the operation, to the main controller 220. Subsequently, the main controller 220 detects an operation position (coordinates) on the display panel 202, on the basis of the received detection signal.

As illustrated in FIG. 11, the display panel 202 and the operation panel 203 of the smartphone 200, which is exemplified as the imaging apparatus according to the above-mentioned embodiment of the present invention, are integrated to constitute the display input section 204, and are disposed such that the operation panel 203 completely covers the display panel 202.

In a case where such an arrangement is adopted, the operation panel 203 may have a function of also detecting a user operation in a area other than the display panel 202. In other words, the operation panel 203 may comprise a detection area (hereinafter referred to as a display area) for a part which overlaps with the display panel 202 and a detection area (hereinafter referred to as a non-display area) for the other part at the outer edge which does not overlap with the display panel 202.

It should be noted that a size of the display area and a size of the display panel 202 may completely coincide with each other, but it is not always necessary for both to coincide with each other. Further, the operation panel 203 may include two sensing areas of the outer edge part and the other inside part. A width of the outer edge part is appropriately designed depending on a size of the housing 201 and the like.

In addition, examples of the position detection method adopted for the operation panel 203 may include a matrix switch method, a resistance film method, a surface elastic wave method, an infrared method, an electromagnetic induction method, an electrostatic capacitance method, and the like, and any method may be adopted.

The speech section 211 comprises a speaker 205 or a microphone 206. The speech section 211 converts a sound of a user, which is input through the microphone 206, into sound data, which can be processed in the main controller 220, and outputs the data to the main controller 220, or decodes sound data, which is received by the wireless communication section 210 or the external input/output section 213, and outputs the data from the speaker 205.

Further, as illustrated in FIG. 11, for example, the speaker 205 can be mounted on the same surface as the surface on which the display input section 204 is provided. In addition, the microphone 206 can be mounted on a side surface of the housing 201.

The operation section 207 is a hardware key using a key switch or the like, and receives an instruction from a user. For example, as illustrated in FIG. 11, the operation sections 207 are button type switches which are mounted on the side surface of the housing 201 of the smartphone 200. Each switch is turned on in a case where it is pressed by a finger or the like, and is turned off due to restoring force of a spring in a case where the finger is released.

The storage section 212 stores a control program or control data of the main controller 220, application software, address data in which names, phone numbers, or the like of communication partners are associated, received and transmitted e-mail data, web data which is downloaded by web browsing, or downloaded contents data, and temporarily stores streaming data and the like. Further, the storage section 212 is constituted of an internal storage section 217, which is built into the smartphone, and an external storage section 218 which has a slot for a removable external memory.

In addition, each of the internal storage section 217 and the external storage section 218 composing the storage section 212 is implemented by using a storage medium such as a flash memory type, a hard disk type, a multimedia card micro type, a card type memory (such as a MicroSD (registered trademark) memory), a random access memory (RAM), or a read only memory (ROM).

The external input/output section 213 has a function of an interface with all external devices connected to the smartphone 200. The external input/output section 213 is for communication (such as universal serial bus (USB) or IEEE1394) with other external devices, direct or indirect connection to networks (such as the Internet, wireless LAN, Bluetooth (registered trademark), radio frequency identification (RFID), infrared communication (Infrared Data Association: IrDA) (registered trademark), ultra wideband (UWB) (registered trademark), and ZigBee (registered trademark)), or the like.

Examples of the external devices connected to the smartphone 200 include a wired/wireless headset, a wired/wireless external electric charger, a wired/wireless data port, a memory card which is connected through a card socket, a subscriber identity module (SIM) or user identity module (UIM) card, external audio/video devices which are connected through audio/video input/output (I/O) terminals, external audio/video devices which are connected in a wireless manner, a smartphone which is connected in a wired or wireless manner, a personal computer which is connected in a wired or wireless manner, a PDA which is connected in a wired or wireless manner, an earphone which is connected in a wired or wireless manner, and the like.

The external input/output section 213 may transfer the data, which is transmitted from such external devices, to the components within the smartphone 200, and to transmit the data within the smartphone 200 to the external devices.

The GPS receiver 214 receives a plurality of GPS signals, which are transmitted from GPS satellites ST1 to STn, in accordance with instructions of the main controller 220, executes positioning calculation processing on the basis of the received GPS signals, and detects a position formed of a latitude, a longitude, and an altitude of the smartphone 200.

The GPS receiver 214 may detect the position by using position information in a case where it is possible to acquire the position information from the wireless communication section 210 or the external input/output section 213 (for example, wireless LAN).

The motion sensor section 215 includes, for example, a triaxial acceleration sensor, and detects physical movement of the smartphone 200, in accordance with an instruction of the main controller 220. By detecting physical movement of the smartphone 200, an acceleration or a direction of the movement of the smartphone 200 is detected. Such a detection result is output to the main controller 220.

The power supply section 216 supplies the respective sections of the smartphone 200 with electric power, which is stored in a battery (not shown), in accordance with an instruction of the main controller 220.

The main controller 220 includes a micro processor, and integrally controls the respective sections of the smartphone 200 by performing an operation on the basis of control data or a control program stored in the storage section 212.

Further, the main controller 220 has an application processing function and a mobile communication control function of controlling the respective sections of a communication system in order to perform data communication or sound communication through the wireless communication section 210.

The application processing function is implemented by an operation of the main controller 220 using application software stored in the storage section 212.

Examples of the application processing function include: an infrared communication function of performing data communication with other devices by controlling the external input/output section 213; an e-mail function of transmitting and receiving e-mails; a web browsing function of browsing web pages; and the like.

Further, the main controller 220 has an image processing function of displaying a video on the display input section 204 and the like, on the basis of image data (still image and moving image data) such as received data or downloaded streaming data.

The image processing function means a function of causing the main controller 220 to decode the image data, apply image processing to the decoding result, and display an image on the display input section 204.

Further, the main controller 220 executes display control for the display panel 202 and operation detection control to detect the user operation through the operation sections 207 and the operation panel 203. Through execution of the display control, the main controller 220 displays an icon for activating application software or a window for displaying a software key such as a scroll bar or creating an e-mail.

In addition, the scroll bar means a software key for receiving an instruction to move a display portion of an image on a large image which cannot be entirely shown in the display area of the display panel 202.

Further, through execution of the operation detection control, the main controller 220 detects the user operation performed through the operation section 207, receives an operation performed on the icon or a text input performed in an input field of the window through the operation panel 203, or receives a request to scroll a displayed image through the scroll bar.

Furthermore, the main controller 220 has a touch panel control function performed through execution of the operation detection control. The function determines whether the operation position of the operation panel 203 is in the overlapping part (display area) which overlaps with the display panel 202 or the other part (non-display area) at the outer edge which does not overlap with the display panel 202, and controls the display position of the software key or the sensing area of the operation panel 203.

In addition, the main controller 220 may detect a gesture operation performed on the operation panel 203, and may execute a preset function in response to the detected gesture operation. The gesture operation is not a simple touch operation used in the past. The gesture operation means an operation for drawing a locus with a finger or the like, an operation of specifying a plurality of positions at the same time, or an operation of drawing loci from a plurality of positions to at least one position as a combination of the above-mentioned operations.

The camera section 208 includes the constituent elements other than the external memory controller 20, the storage medium 21, the display controller 22, the display section 23, and the operation section 14 in the digital camera illustrated in FIG. 1.

The captured image data, which is generated by the camera section 208, can be stored in the storage section 212, or can be output through the external input/output section 213 or the wireless communication section 210.

In the smartphone 200 illustrated in FIG. 11, the camera section 208 is mounted on the same side as the display input section 204. However, the mounting position of the camera section 208 is not limited to this. The camera section 208 may be mounted on the rear side of the display input section 204.

Further, the camera section 208 can be used in various functions of the smartphone 200. For example, the image acquired by the camera section 208 can be displayed on the display panel 202. The image of the camera section 208 can be used as one of the operation inputs of the operation panel 203.

Further, in a case where the GPS receiver 214 detects a position, the GPS receiver 214 may detect the position with reference to an image obtained from the camera section 208. Further, it may be possible to determine a direction of an optical axis of the camera section 208 of the smartphone 200 or determine a current usage environment, using the GPS receiver 214 in a combination with the triaxial acceleration sensor or without using the triaxial acceleration sensor, with reference to the image acquired from the camera section 208. Needless to say, the image acquired from the camera section 208 may be used in the application software.

Otherwise, the position information acquired by the GPS receiver 214, the sound information acquired by the microphone 206 (or text information obtained through sound text conversion performed by the main controller or the like), posture information acquired by the motion sensor section 215, and the like may be added to the image data of the still image or the moving image, and the image data may be stored in the storage section 212, or may be output through the external input/output section 213 or the wireless communication section 210.

In the above description, the imaging element 5 is the MOS type, but the present invention is similarly applicable even in a case where the imaging element 5 is a CCD type.

As described above, the following items are disclosed in this specification.

(1) An imaging apparatus comprising: an imaging element that has a sensor section, which includes a light-receiving surface where a plurality of pixel rows each consisting of a plurality of pixels arranged in one direction are arranged in a direction orthogonal to the one direction and which captures an image of a subject through an imaging optical system, and a storage section which stores a signal output from the sensor section; an imaging controller that performs imaging control including actual imaging control, which causes the sensor section to perform actual imaging for storage and which causes the sensor section to output an imaging signal corresponding to an electric charge accumulated in each of the plurality of pixels through the actual imaging, and temporary imaging control which causes the sensor section to perform temporary imaging for determining an imaging condition at actual imaging subsequent to the actual imaging under an exposure condition different from an exposure condition at the actual imaging after the imaging signal is stored in the storage section through the actual imaging control and which causes the sensor section to output an imaging signal corresponding to an electric charge accumulated in each of some pixels of the plurality of pixels through the temporary imaging; a signal output controller that causes the imaging element to output the imaging signal stored in the storage section through the imaging control; and an imaging condition determination section that determines the imaging condition at the subsequent actual imaging, on the basis of at least a second imaging signal out of a first imaging signal, which is output from the sensor section through the actual imaging control, stored in the storage section, and output from the imaging element by the signal output controller, and the second imaging signal which is output from the sensor section through the temporary imaging control, stored in the storage section, and output from the imaging element by the signal output controller. The signal output controller divides the first imaging signal stored in the storage section into a plurality of groups and sequentially outputs the first imaging signal from the imaging element for each of the groups. The imaging controller causes the sensor section to perform the temporary imaging by performing the temporary imaging control, during a period from when all the imaging signals belonging to at least one of the groups are output from the imaging element until all the imaging signals belonging to all the groups are output from the imaging element.

(2) The imaging apparatus according to (1), in which the imaging controller determines the exposure condition at the temporary imaging on the basis of the imaging signal stored in the storage section through the imaging performed by the sensor section before the actual imaging.

(3) The imaging apparatus according to (2), in which a continuous imaging mode in which a plurality of operations of the imaging control are continuously performed is provided, and in which in the continuous imaging mode, the imaging condition determination section determines the exposure condition at the temporary imaging performed after the actual imaging on the basis of at least one of the imaging signal which is stored in the storage section through the actual imaging control performed before the actual imaging, or the imaging signal which is stored in the storage section through the temporary imaging control performed before the actual imaging.

(4) The imaging apparatus according to any one of (1) to (3), in which the imaging control includes the actual imaging control and a plurality of operations of the temporary imaging control.

(5) The imaging apparatus according to (4), in which the plurality of operations of the temporary imaging control respectively have different exposure conditions for the temporary imaging.

(6) The imaging apparatus according to (4), in which the exposure condition at the temporary imaging is the same for at least two operations of the temporary imaging control among the plurality of operations of the temporary imaging control.

(7) The imaging apparatus according to any one of (4) to (6), in which the imaging controller performs at least one operation of the temporary imaging control in association with each of a plurality of selection areas in a case where the plurality of selection areas are selected from a plurality of areas which are set on the light-receiving surface and used for determining the imaging condition.

(8) The imaging apparatus according to (7), in which the imaging controller sets the exposure condition at the temporary imaging of the temporary imaging control performed in association with the selection area such that an exposure value of the selection area is set as a predetermined exposure value.

(9) The imaging apparatus according to (7) or (8), in which a continuous imaging mode in which a plurality of operations of the imaging control are continuously performed is provided, and in which the imaging controller sets an upper limit value of the number of the plurality of operations of the temporary imaging control performed subsequent to the actual imaging control such that the upper limit value is larger as a setting value of an interval between two consecutive operations of the actual imaging performed in the continuous imaging mode is larger.

(10) The imaging apparatus according to (9), in which in a case where the number of the selection areas is larger than the upper limit value, the imaging controller estimates an area of the light-receiving surface, on which an image of the subject to be focused at the latest actual imaging which is not performed is formed, on the basis of information about the subject focused at the previous actual imaging performed in accordance with an imaging instruction issued in the continuous imaging mode, and performs the temporary imaging control, which corresponds to the selection area including at least the estimated area, on the selection area.

(11) The imaging apparatus according to any one of (1) to (10), in which the imaging condition determination section calculates a brightness of the subject being imaged on the basis of at least the second imaging signal out of the first imaging signal and the second imaging signal, and determines the exposure value for the subsequent actual imaging as the imaging condition on the basis of the brightness.

(12) The imaging apparatus according to any one of (1) to (11), in which some of the pixels include phase difference detection pixels, and in which the imaging condition determination section calculates a defocus amount on the basis of at least the second imaging signal out of the first imaging signal and the second imaging signal, and determines an in-focus position of the imaging optical system during the subsequent actual imaging as the imaging condition on the basis of the defocus amount.

(13) An imaging method of using an imaging element that has a sensor section, which includes a light-receiving surface where a plurality of pixel rows each consisting of a plurality of pixels arranged in one direction are arranged in a direction orthogonal to the one direction and which captures an image of a subject through an imaging optical system, and a storage section which stores a signal output from the sensor section, the imaging method comprising: an imaging control step of performing imaging control including actual imaging control, which causes the sensor section to perform actual imaging for storage and which causes the sensor section to output an imaging signal corresponding to electric charge accumulated in each of the plurality of pixels through the actual imaging, and temporary imaging control which causes the sensor section to perform temporary imaging for determining an imaging condition at actual imaging subsequent to the actual imaging under an exposure condition different from an exposure condition of the actual imaging after the imaging signal is stored in the storage section through the actual imaging control and which causes the sensor section to output an imaging signal corresponding to electric charge accumulated in each of some pixels of the plurality of pixels through the temporary imaging; a signal output control step of causing the imaging element to output the imaging signal stored in the storage section through the imaging control; and an imaging condition determination step of determining the imaging condition at the subsequent actual imaging, on the basis of at least a second imaging signal out of a first imaging signal, which is output from the sensor section through the actual imaging control, stored in the storage section, and output from the imaging element by the signal output control step, and the second imaging signal which is output from the sensor section through the temporary imaging control, stored in the storage section, and output from the imaging element by the signal output control step. In the signal output control step, the first imaging signal stored in the storage section is divided into a plurality of groups and is sequentially output from the imaging element for each of the groups. In the imaging control step, the sensor section performs the temporary imaging by performing the temporary imaging control, during a period from when all the imaging signals belonging to at least one of the groups are output from the imaging element until all the imaging signals belonging to all the groups are output from the imaging element.

(14) The imaging method according to (13), in which in the imaging control step, the exposure condition at the temporary imaging is determined on the basis of the imaging signal stored in the storage section through the imaging performed by the sensor section before the actual imaging.

(15) The imaging method according to (14), in which in a case where a plurality of operations of the imaging control are continuously performed, in the imaging condition determination step, the exposure condition at the temporary imaging performed after the actual imaging is determined on the basis of at least one of the imaging signal which is stored in the storage section through the actual imaging control performed before the actual imaging, or the imaging signal which is stored in the storage section through the temporary imaging control performed before the actual imaging.

(16) The imaging method according to any one of (13) to (15), in which the imaging control includes the actual imaging control and a plurality of operations of the temporary imaging control.

(17) The imaging method according to (16), in which the plurality of operations of the temporary imaging control respectively have different exposure conditions for the temporary imaging.

(18) The imaging method according to (16), in which the exposure condition at the temporary imaging is the same for at least two operations of the temporary imaging control among the plurality of operations of the temporary imaging control.

(19) The imaging method according to any one of (16) to (18), in which in the imaging control step, at least one operation of the temporary imaging control is performed in association with each of a plurality of selection areas in a case where the plurality of selection areas are selected from a plurality of areas which are set on the light-receiving surface and used for determining the imaging condition.

(20) The imaging method according to (19), in which in the imaging control step, the exposure condition at the temporary imaging of the temporary imaging control performed in association with the selection area is set such that an exposure value of the selection area is set as a predetermined exposure value.

(21) The imaging method according to (19) or (20), in which in the imaging control step, in a case where a plurality of operations of the imaging control are continuously performed, an upper limit value of the number of the plurality of operations of the temporary imaging control performed subsequent to the actual imaging control is set such that the upper limit value is larger as a setting value of an interval between two consecutive operations of the actual imaging is larger.

(22) The imaging method according to (21), in which in the imaging control step, in a case where the number of the selection areas is larger than the upper limit value, an area of the light-receiving surface, on which an image of the subject to be focused at the latest actual imaging which is not performed is formed, is estimated on the basis of information about the subject focused at the previous actual imaging of the plurality of operations of the actual imaging, and the temporary imaging control, which corresponds to the selection area including at least the estimated area, is performed on the selection area.

(23) The imaging method according to any one of (13) to (22), in which in the imaging condition determination step, a brightness of the subject being imaged is calculated on the basis of at least the second imaging signal out of the first imaging signal and the second imaging signal, and the exposure value for the subsequent actual imaging is determined as the imaging condition on the basis of the brightness.

(24) The imaging method according to any one of (13) to (23), in which some of the pixels include phase difference detection pixels, and in which in the imaging condition determination step, a defocus amount is calculated on the basis of at least the second imaging signal out of the first imaging signal and the second imaging signal, and an in-focus position of the imaging optical system during the subsequent actual imaging is determined as the imaging condition on the basis of the defocus amount.

(25) An imaging program for capturing an image of a subject by using an imaging element that has a light-receiving surface in which a plurality of pixel rows each consisting of a plurality of pixels arranged in one direction are arranged in a direction orthogonal to the one direction and a storage section which stores signals read out from the plurality of pixels so as to capture the image of the subject through an imaging optical system, the imaging program causing a computer to execute: an imaging control step of performing imaging control including actual imaging control, which causes the imaging element to perform actual imaging for storage and which reads an imaging signal corresponding to electric charge accumulated in each of the plurality of pixels through the actual imaging, and temporary imaging control which causes the imaging element to perform temporary imaging for determining an imaging condition at actual imaging subsequent to the actual imaging under an exposure condition different from an exposure condition of the actual imaging after the imaging signal is stored in the storage section through the actual imaging control and which reads an imaging signal corresponding to electric charge accumulated in each of some pixels of the plurality of pixels through the temporary imaging; a signal output control step of causing the imaging element to output the imaging signal stored in the storage section through the imaging control; and an imaging condition determination step of determining the imaging condition at the subsequent actual imaging, on the basis of at least a second imaging signal out of a first imaging signal, which is output from the plurality of pixels through the actual imaging control, stored in the storage section, and output from the imaging element by the signal output control step, and the second imaging signal which is output from the some pixels through the temporary imaging control, stored in the storage section, and output from the imaging element by the signal output control step. In the signal output control step, the first imaging signal stored in the storage section is divided into a plurality of groups and is sequentially output from the imaging element for each of the groups. In the imaging control step, the imaging element performs the temporary imaging by performing the temporary imaging control, during a period from when all the imaging signals belonging to at least one of the groups are output from the imaging element until all the imaging signals belonging to all the groups are output from the imaging element.

INDUSTRIAL APPLICABILITY

According to the embodiments of the present invention, it is possible to achieve both shortening of the imaging interval and improvement of imaging quality in a case where imaging for storage is continuously performed.

Although the present invention has been described with reference to specific embodiments, the present invention is not limited to this embodiment, and various modifications are possible without departing from the technical concept of the disclosed invention.

This application is on the basis of Japanese patent application (Japanese Patent Application No. 2016-181517) filed on Sep. 16, 2016, the content of which is incorporated herein.

EXPLANATION OF REFERENCES

1: imaging lens
2: stop
4: lens controller
5: imaging element
40: lens device
51: sensor section
60: light-receiving surface
60A: photometry distance measurement area
61: pixel
62: pixel row
63: driving circuit
64: signal processing circuit
X: row direction
Y: column direction
F1 to F4: field
52: storage section
71 to 73: main subject
8: lens driving section
9: stop driving section
10: sensor driving section
11: system controller
11A: imaging controller
11B: signal output controller
11C: imaging condition determination section
14: operation section
17: digital signal processing section
20: external memory controller
21: storage medium
22: display controller
23: display section
24: control bus
25: data bus
R1 to R4: straight line indicating reset timing
O1 to O4: straight line indicating exposure end timing
f1a, f2a, f3a, f4a, f1b, f1c, f1d: straight line indicating output timing of signal from storage section
Ta, Tb, Tc, Td: exposure time
200: smartphone 201: housing
202: display panel
203: operation Panel
204: display input section
205: speaker
206: microphone
207: operation section
208: camera section
210: wireless communication section
211: speech section
212: storage section
213: external input/output section
214: GPS receiver
215: motion sensor section
216: power supply section
217: internal storage section
218: external storage section
220: main controller
ST1 to STn: GPS satellite

What is claimed is:

1. An imaging apparatus comprising:
an imaging element that has a sensor section, which includes a light-receiving surface where a plurality of pixel rows each consisting of a plurality of pixels arranged in one direction are arranged in a direction orthogonal to the one direction and which captures an image of a subject through an imaging optical system, and a storage which stores a signal output from the sensor section;
an imaging controller that performs imaging control including actual imaging control, which causes the sensor section to perform actual imaging for storage and which causes the sensor section to output an imaging signal corresponding to an electric charge accumulated in each of the plurality of pixels through the actual imaging, and temporary imaging control which causes the sensor section to perform temporary imaging for determining an imaging condition at actual imaging subsequent to the actual imaging under an exposure condition different from an exposure condition at the actual imaging after the imaging signal is stored in the storage through the actual imaging control and which causes the sensor section to output an imaging signal corresponding to an electric charge accumulated in each of some pixels of the plurality of pixels through the temporary imaging;
a signal output controller that causes the imaging element to output the imaging signal stored in the storage through the imaging control;
an imaging condition determination section that determines the imaging condition at the subsequent actual imaging, based on at least a second imaging signal among a first imaging signal, which is output from the sensor section through the actual imaging control, stored in the storage, and output from the imaging element by the signal output controller, and the second imaging signal which is output from the sensor section through the temporary imaging control, stored in the storage, and output from the imaging element by the signal output controller; and
at least one processor configured to implement the imaging controller, the signal output controller, and the imaging condition determination section,
wherein the signal output controller divides the first imaging signal stored in the storage into a plurality of groups and sequentially outputs the first imaging signal from the imaging element for each of the groups, and
wherein the imaging controller causes the sensor section to perform the temporary imaging by performing the temporary imaging control, during a period from when the imaging signals belonging to at least one of the groups are output from the imaging element until the imaging signals belonging to all the groups are output from the imaging element, and determines the exposure condition at the temporary imaging based on the imaging signal stored in the storage through the imaging performed by the sensor section before the actual imaging.

2. The imaging apparatus according to claim 1,
wherein a continuous imaging mode in which a plurality of operations of the imaging control are continuously performed is provided, and
wherein, in the continuous imaging mode, the imaging controller determines the exposure condition at the temporary imaging performed after the actual imaging based on at least one of the imaging signal which is stored in the storage through the actual imaging control performed before the actual imaging, or the imaging signal which is stored in the storage through the temporary imaging control performed before the actual imaging.

3. The imaging apparatus according to claim 1,
wherein the imaging control includes the actual imaging control and a plurality of operations of the temporary imaging control.

4. The imaging apparatus according to claim 3,
wherein the plurality of operations of the temporary imaging control respectively have different exposure conditions for the temporary imaging.

5. The imaging apparatus according to claim 3,
wherein the exposure condition at the temporary imaging is same for at least two operations of the temporary imaging control among the plurality of operations of the temporary imaging control.

6. The imaging apparatus according to claim 1,
wherein the imaging condition determination section calculates a brightness of the subject being imaged based on at least the second imaging signal among the first imaging signal and the second imaging signal, and determines the exposure value for the subsequent actual imaging as the imaging condition based on the brightness.

7. The imaging apparatus according to claim 1,
wherein the some pixels include phase difference detection pixels, and
wherein the imaging condition determination section calculates a defocus amount based on at least the second imaging signal among the first imaging signal and the second imaging signal, and determines an in-focus position of the imaging optical system during the subsequent actual imaging as the imaging condition based on the defocus amount.

8. An imaging apparatus comprising:
an imaging element that has a sensor section, which includes a light-receiving surface where a plurality of pixel rows each consisting of a plurality of pixels arranged in one direction are arranged in a direction orthogonal to the one direction and which captures an image of a subject through an imaging optical system, and a storage which stores a signal output from the sensor section;
an imaging controller that performs imaging control including actual imaging control, which causes the sensor section to perform actual imaging for storage and which causes the sensor section to output an imaging signal corresponding to an electric charge accumulated in each of the plurality of pixels through the actual imaging, and temporary imaging control which causes the sensor section to perform temporary imaging for determining an imaging condition at actual imaging subsequent to the actual imaging under an exposure condition different from an exposure condition at the actual imaging after the imaging signal is stored in the storage through the actual imaging control and which causes the sensor section to output an imaging signal corresponding to an electric charge accumulated in each of some pixels of the plurality of pixels through the temporary imaging;

a signal output controller that causes the imaging element to output the imaging signal stored in the storage through the imaging control;

an imaging condition determination section that determines the imaging condition at the subsequent actual imaging, based on at least a second imaging signal among a first imaging signal, which is output from the sensor section through the actual imaging control, stored in the storage, and output from the imaging element by the signal output controller, and the second imaging signal which is output from the sensor section through the temporary imaging control, stored in the storage, and output from the imaging element by the signal output controller; and at least one processor configured to implement the imaging controller, the signal output controller, and the imaging condition determination section, wherein the signal output controller divides the first imaging signal stored in the storage into a plurality of groups and sequentially outputs the first imaging signal from the imaging element for each of the groups, wherein the imaging controller causes the sensor section to perform the temporary imaging by performing the temporary imaging control, during a period from when the imaging signals belonging to at least one of the groups are output from the imaging element until all the imaging signals belonging to all the groups are output from the imaging element, wherein the imaging control performed by the imaging controller includes the actual imaging control and a plurality of operations of the temporary imaging control, and wherein the imaging controller performs at least one operation of the temporary imaging control in association with each of a plurality of selection areas in a case where the plurality of selection areas are selected from a plurality of areas which are set on the light-receiving surface and used for determining the imaging condition.

9. The imaging apparatus according to claim 8, wherein the imaging controller sets the exposure condition at the temporary imaging of the temporary imaging control performed in association with the selection area such that an exposure value of the selection area is set as a predetermined exposure value.

10. The imaging apparatus according to claim 8, wherein a continuous imaging mode in which a plurality of operations of the imaging control are continuously performed is provided, and wherein the imaging controller sets an upper limit value of number of the plurality of operations of the temporary imaging control performed subsequent to the actual imaging control such that the upper limit value is larger as a setting value of an interval between two consecutive operations of the actual imaging performed in the continuous imaging mode is larger.

11. The imaging apparatus according to claim 10, wherein in a case where the number of the selection areas is larger than the upper limit value, the imaging controller estimates an area of the light-receiving surface, on which an image of the subject to be focused at the latest actual imaging which is not performed is formed, based on information about the subject focused at the previous actual imaging performed in accordance with an imaging instruction issued in the continuous imaging mode, and performs the temporary imaging control, which corresponds to the selection area including at least the estimated area, on the selection area.

12. An imaging method of using an imaging element that has a sensor section, which includes a light-receiving surface where a plurality of pixel rows each consisting of a plurality of pixels arranged in one direction are arranged in a direction orthogonal to the one direction and which captures an image of a subject through an imaging optical system, and a storage which stores a signal output from the sensor section, the imaging method comprising:

an imaging control step of performing imaging control including actual imaging control, which causes the sensor section to perform actual imaging for storage and which causes the sensor section to output an imaging signal corresponding to an electric charge accumulated in each of the plurality of pixels through the actual imaging, and temporary imaging control which causes the sensor section to perform temporary imaging for determining an imaging condition at actual imaging subsequent to the actual imaging under an exposure condition different from an exposure condition of the actual imaging after the imaging signal is stored in the storage through the actual imaging control and which causes the sensor section to output an imaging signal corresponding to an electric charge accumulated in each of some pixels of the plurality of pixels through the temporary imaging;

a signal output control step of causing the imaging element to output the imaging signal stored in the storage through the imaging control; and an imaging condition determination step of determining the imaging condition at the subsequent actual imaging, based on at least a second imaging signal among a first imaging signal, which is output from the sensor section through the actual imaging control, stored in the storage, and output from the imaging element by the signal output control step, and the second imaging signal which is output from the sensor section through the temporary imaging control, stored in the storage, and output from the imaging element by the signal output control step, wherein, in the signal output control step, the first imaging signal stored in the storage is divided into a plurality of groups and is sequentially output from the imaging element for each of the groups, and wherein, in the imaging control step, the sensor section performs the temporary imaging by performing the temporary imaging control, during a period from when the imaging signals belonging to at least one of the groups are output from the imaging element until all the imaging signals belonging to all the groups are output from the imaging element, and the exposure condition at the temporary imaging is determined based on the imaging signal stored in the storage through the imaging performed by the sensor section before the actual imaging.

13. The imaging method according to claim 12,
wherein in a case where a plurality of operations of the imaging control are continuously performed, in the imaging control step, the exposure condition at the temporary imaging performed after the actual imaging is determined based on at least one of the imaging signal which is stored in the storage through the actual imaging control performed before the actual imaging, or the imaging signal which is stored in the storage through the temporary imaging control performed before the actual imaging.

14. The imaging method according to claim 12,
wherein the imaging control includes the actual imaging control and a plurality of operations of the temporary imaging control.

15. The imaging method according to claim 14,
wherein the plurality of operations of the temporary imaging control respectively have different exposure conditions for the temporary imaging.

16. The imaging method according to claim 14,
wherein the exposure condition at the temporary imaging is same for at least two operations of the temporary imaging control among the plurality of operations of the temporary imaging control.

17. The imaging method according to claim 12,
wherein, in the imaging condition determination step, a brightness of the subject being imaged is calculated based on at least the second imaging signal among the first imaging signal and the second imaging signal, and the exposure value for the subsequent actual imaging is determined as the imaging condition based on the brightness.

18. The imaging method according to claim 12,
wherein the some pixels include phase difference detection pixels, and
wherein, in the imaging condition determination step, a defocus amount is calculated based on at least the second imaging signal among the first imaging signal and the second imaging signal, and an in-focus position of the imaging optical system during the subsequent actual imaging is determined as the imaging condition based on the defocus amount.

19. An imaging method of using an imaging element that has a sensor section, which includes a light-receiving surface where a plurality of pixel rows each consisting of a plurality of pixels arranged in one direction are arranged in a direction orthogonal to the one direction and which captures an image of a subject through an imaging optical system, and a storage which stores a signal output from the sensor section, the imaging method comprising:
an imaging control step of performing imaging control including actual imaging control, which causes the sensor section to perform actual imaging for storage and which causes the sensor section to output an imaging signal corresponding to an electric charge accumulated in each of the plurality of pixels through the actual imaging, and temporary imaging control which causes the sensor section to perform temporary imaging for determining an imaging condition at actual imaging subsequent to the actual imaging under an exposure condition different from an exposure condition of the actual imaging after the imaging signal is stored in the storage through the actual imaging control and which causes the sensor section to output an imaging signal corresponding to an electric charge accumulated in each of some pixels of the plurality of pixels through the temporary imaging;
a signal output control step of causing the imaging element to output the imaging signal stored in the storage through the imaging control; and
an imaging condition determination step of determining the imaging condition at the subsequent actual imaging, based on at least a second imaging signal among a first imaging signal, which is output from the sensor section through the actual imaging control, stored in the storage, and output from the imaging element by the signal output control step, and the second imaging signal which is output from the sensor section through the temporary imaging control, stored in the storage, and output from the imaging element by the signal output control step,
wherein, in the signal output control step, the first imaging signal stored in the storage is divided into a plurality of groups and is sequentially output from the imaging element for each of the groups,
wherein, in the imaging control step, the sensor section performs the temporary imaging by performing the temporary imaging control, during a period from when the imaging signals belonging to at least one of the groups are output from the imaging element until all the imaging signals belonging to all the groups are output from the imaging element,
wherein the imaging control in the imaging control step includes the actual imaging control and a plurality of operations of the temporary imaging control, and
wherein, in the imaging control step, at least one operation of the temporary imaging control is performed in association with each of a plurality of selection areas in a case where the plurality of selection areas are selected from a plurality of areas which are set on the light-receiving surface and used for determining the imaging condition.

20. The imaging method according to claim 19,
wherein, in the imaging control step, the exposure condition at the temporary imaging of the temporary imaging control performed in association with the selection area is set such that an exposure value of the selection area is set as a predetermined exposure value.

21. The imaging method according to claim 19,
wherein, in the imaging control step, in a case where a plurality of operations of the imaging control are continuously performed, an upper limit value of number of the plurality of operations of the temporary imaging control performed subsequent to the actual imaging control is set such that the upper limit value is larger as a setting value of an interval between two consecutive operations of the actual imaging is larger.

22. The imaging method according to claim 21,
wherein, in the imaging control step, in a case where the number of the selection areas is larger than the upper limit value, an area of the light-receiving surface, on which an image of the subject to be focused at the latest actual imaging which is not performed is formed, is estimated based on information about the subject focused at the previous actual imaging of the plurality of operations of the actual imaging, and the temporary imaging control, which corresponds to the selection area including at least the estimated area, is performed on the selection area.

23. A non-transitory computer readable medium storing an imaging program for capturing an image of a subject by using an imaging element that has a light-receiving surface in which a plurality of pixel rows each consisting of a plurality of pixels arranged in one direction are arranged in a direction orthogonal to the one direction and a storage which stores signals read out from the plurality of pixels so as to capture the image of the subject through an imaging optical system, the imaging program causing a computer to execute:

an imaging control step of performing imaging control including actual imaging control, which causes the imaging element to perform actual imaging for storage and which reads an imaging signal corresponding to an electric charge accumulated in each of the plurality of pixels through the actual imaging, and temporary imaging control which causes the imaging element to perform temporary imaging for determining an imaging condition at actual imaging subsequent to the actual imaging under an exposure condition different from an exposure condition of the actual imaging after the imaging signal is stored in the storage through the actual imaging control and which reads an imaging signal corresponding to an electric charge accumulated in each of some pixels of the plurality of pixels through the temporary imaging;

a signal output control step of causing the imaging element to output the imaging signal stored in the storage through the imaging control; and an imaging condition determination step of determining the imaging condition at the subsequent actual imaging, based on at least a second imaging signal among a first imaging signal, which is output from the plurality of pixels through the actual imaging control, stored in the storage, and output from the imaging element by the signal output control step, and the second imaging signal which is output from the some pixels through the temporary imaging control, stored in the storage, and output from the imaging element by the signal output control step, wherein, in the signal output control step, the first imaging signal stored in the storage is divided into a plurality of groups and is sequentially output from the imaging element for each of the groups, and wherein, in the imaging control step, the imaging element performs the temporary imaging by performing the temporary imaging control, during a period from when the imaging signals belonging to at least one of the groups are output from the imaging element until all the imaging signals belonging to all the groups are output from the imaging element, and the exposure condition at the temporary imaging is determined based on the imaging signal stored in the storage through the imaging performed before the actual imaging.

24. A non-transitory computer readable medium storing an imaging program for capturing an image of a subject by using an imaging element that has a light-receiving surface in which a plurality of pixel rows each consisting of a plurality of pixels arranged in one direction are arranged in a direction orthogonal to the one direction and a storage which stores signals read out from the plurality of pixels so as to capture the image of the subject through an imaging optical system, the imaging program causing a computer to execute:

an imaging control step of performing imaging control including actual imaging control, which causes the imaging element to perform actual imaging for storage and which reads an imaging signal corresponding to an electric charge accumulated in each of the plurality of pixels through the actual imaging, and temporary imaging control which causes the imaging element to perform temporary imaging for determining an imaging condition at actual imaging subsequent to the actual imaging under an exposure condition different from an exposure condition of the actual imaging after the imaging signal is stored in the storage through the actual imaging control and which reads an imaging signal corresponding to an electric charge accumulated in each of some pixels of the plurality of pixels through the temporary imaging;

a signal output control step of causing the imaging element to output the imaging signal stored in the storage through the imaging control; and an imaging condition determination step of determining the imaging condition at the subsequent actual imaging, based on at least a second imaging signal among a first imaging signal, which is output from the plurality of pixels through the actual imaging control, stored in the storage, and output from the imaging element by the signal output control step, and the second imaging signal which is output from the some pixels through the temporary imaging control, stored in the storage, and output from the imaging element by the signal output control step, wherein, in the signal output control step, the first imaging signal stored in the storage is divided into a plurality of groups and is sequentially output from the imaging element for each of the groups, wherein, in the imaging control step, the imaging element performs the temporary imaging by performing the temporary imaging control, during a period from when the imaging signals belonging to at least one of the groups are output from the imaging element until all the imaging signals belonging to all the groups are output from the imaging element, wherein the imaging control in the imaging control step includes the actual imaging control and a plurality of operations of the temporary imaging control, and wherein, in the imaging control step, at least one operation of the temporary imaging control is performed in association with each of a plurality of selection areas in a case where the plurality of selection areas are selected from a plurality of areas which are set on the light-receiving surface and used for determining the imaging condition.

\* \* \* \* \*